US 11,740,258 B2

(12) United States Patent
Tanaka

(10) Patent No.: US 11,740,258 B2
(45) Date of Patent: Aug. 29, 2023

(54) PHYSICAL QUANTITY SENSOR, ELECTRONIC APPARATUS, AND VEHICLE

(71) Applicant: Seiko Epson Corporation, Toyko (JP)

(72) Inventor: Satoru Tanaka, Chino (JP)

(73) Assignee: SEIKO EPSON CORPORATION

(*) Notice: Subject to any disclaimer, the term of this patent is extended or adjusted under 35 U.S.C. 154(b) by 49 days.

(21) Appl. No.: 17/241,122

(22) Filed: Apr. 27, 2021

(65) Prior Publication Data

US 2021/0333303 A1    Oct. 28, 2021

(30) Foreign Application Priority Data

Apr. 28, 2020    (JP) ................... 2020-079501

(51) Int. Cl.
*G01P 15/08*    (2006.01)
*B60R 21/013*    (2006.01)

(52) U.S. Cl.
CPC ........... *G01P 15/08* (2013.01); *B60R 21/013* (2013.01); *B60R 2021/01306* (2013.01); *G01P 2015/0831* (2013.01)

(58) Field of Classification Search
CPC ........... G01P 15/08; G01P 2015/0831; G01P 15/0802; G01P 15/18; G01P 15/125; B60R 21/013; B60R 2021/01306; G01C 19/5712; B81B 2203/0181; B81B 2203/033; B81B 2203/0392; B81B 3/001
USPC .................................................. 73/514.16
See application file for complete search history.

(56) References Cited

U.S. PATENT DOCUMENTS

| 2005/0109109 | A1  | 5/2005 | Eskridge et al. |
| 2006/0169043 | A1  | 8/2006 | McNeil |
| 2013/0042684 | A1  | 2/2013 | Yoda |
| 2015/0040667 | A1  | 2/2015 | Tanaka |
| 2017/0088413 | A1* | 3/2017 | Tanaka ............... B81B 3/001 |
| 2019/0062149 | A1  | 2/2019 | Tanaka |
| 2019/0063924 | A1  | 2/2019 | Tanaka |

(Continued)

FOREIGN PATENT DOCUMENTS

| JP | 2008-529001 A | 7/2008 |
| JP | 2013-040856 A | 2/2013 |

(Continued)

OTHER PUBLICATIONS

English translation for JP-2019113330-A (Year: 2019).*

*Primary Examiner* — Alesa Allgood
*Assistant Examiner* — Byung Ro Lee
(74) *Attorney, Agent, or Firm* — Harness, Dickey & Pierce, P.L.C.

(57) ABSTRACT

The physical quantity sensor includes a substrate having several areas, a movable body, and a detection electrode. The detection electrode straddles the several areas. When setting a first imaginary straight line which is the smallest in an angle formed with an X-axis direction of imaginary straight lines connecting two of end parts on respective areas of the detection electrode, and a second imaginary straight line extending along a principal surface of the movable body in a maximum displacement state around the oscillation axis, the first and second imaginary straight lines fail to cross each other in an area between a first normal line which passes the end part of the first one of the several areas and a second normal line which passes the end part of the last one of the several areas.

12 Claims, 22 Drawing Sheets

(56) References Cited

U.S. PATENT DOCUMENTS

| | | |
|---|---|---|
| 2019/0064201 A1 | 2/2019 | Tanaka |
| 2019/0064202 A1 | 2/2019 | Tanaka |
| 2019/0120872 A1 | 4/2019 | Geisberger |
| 2019/0302142 A1 | 10/2019 | Tanaka |
| 2020/0039814 A1 | 2/2020 | Tanaka |
| 2020/0309814 A1 | 10/2020 | Takizawa et al. |

FOREIGN PATENT DOCUMENTS

| | | | |
|---|---|---|---|
| JP | 2015-031644 A | | 2/2015 |
| JP | 2019-045167 A | | 3/2019 |
| JP | 2019-045170 A | | 3/2019 |
| JP | 2019-045171 A | | 3/2019 |
| JP | 2019-045172 A | | 3/2019 |
| JP | 2019113330 A | * | 7/2019 |
| JP | 2019-184261 A | | 10/2019 |
| JP | 2020-024098 A | | 2/2020 |
| JP | 2020-159917 A | | 10/2020 |

* cited by examiner

PHYSICAL QUANTITY SENSOR, ELECTRONIC APPARATUS, AND VEHICLE

The present application is based on, and claims priority from JP Application Serial Number 2020-079501, filed Apr. 28, 2020, the disclosure of which is hereby incorporated by reference herein in its entirety.

BACKGROUND

1. Technical Field

The present disclosure relates to a physical quantity sensor, an electronic apparatus, and a vehicle.

2. Related Art

For example, the acceleration sensor described in JP-A-2013-040856 (Document 1) has a substrate, a sensor section which is located at a positive side in a Z-axis direction of the substrate, and which rotates around an oscillation axis with respect to the substrate, and a detection electrode which is provided to the substrate to detect a capacitance generated between the detection electrode and the sensor section. In such an acceleration sensor, when the acceleration in the Z-axis direction is applied, the sensor section makes a seesaw oscillation around the oscillation axis, and accordingly, a distance between the sensor section and the detection electrode varies to vary the capacitance described above. Therefore, it is possible for such an acceleration sensor to detect the acceleration based on the variation in the capacitance.

Further, the acceleration sensor described in Document 1 has a recessed part which is provided to a surface of the substrate opposed to the sensor section, and which functions as a clearance for avoiding contact with the sensor section. Further, the recessed part has a first recessed part which has a detection electrode disposed on a bottom surface, and a second recessed part which is located at a farther side from the oscillation axis than the first recessed part, and which is deeper than the first recessed part. As described above, by making the recessed part have a multistep shape, it is possible to shorten the separation distance between the sensor section and the detection electrode while preventing the contact between the sensor section and the substrate to thereby achieve an increase in sensitivity of the acceleration sensor.

However, even in such a configuration, there is a possibility that the sensor section and the substrate make contact with each other at a corner part located in a boundary part between the first recessed part and the second recessed part.

SUMMARY

A physical quantity sensor according to the present disclosure includes a substrate, a movable body which is opposed to the substrate in a third direction with a gap, and which oscillates around an oscillation axis along a second direction perpendicular to the third direction with respect to the substrate, and a detection electrode disposed so as to be opposed to the movable body, wherein the substrate has a first area through an m-th (m is an integer no smaller than 2) area disposed in sequence from a side close to the oscillation axis, the first area through the m-th area are each opposed to the movable body with a gap, the detection electrode is disposed so as to straddle the first area through an n-th area (n is an integer no smaller than 2 and fulfills n≤m), and in a cross-sectional view from the second direction, when setting a first imaginary straight line which is smallest in an angle formed with a first direction perpendicular to the second direction and the third direction out of imaginary straight lines connecting two of end parts located at a far side from the oscillation axis of respective areas of the first area through the n-th area of the detection electrode, and a second imaginary straight line extending along a principal surface located at the substrate side of the movable body in a state in which the movable body makes a maximum displacement around the oscillation axis, the first imaginary straight line and the second imaginary straight line fail to cross each other in an area between a first normal line which passes the end part of the first area, and which extends in the third direction, and a second normal line which passes the end part in the n-th area, and which extends in the third direction.

An electronic apparatus according to the present disclosure includes the physical quantity sensor described above, and a control circuit configured to perform control based on a detection signal output from the physical quantity sensor.

A vehicle according to the present disclosure includes the physical quantity sensor described above, and a control circuit configured to perform control based on a detection signal output from the physical quantity sensor.

DESCRIPTION OF EXEMPLARY EMBODIMENTS

Hereinafter, a physical quantity sensor, an electronic apparatus, and a vehicle according to the present disclosure will be described in detail based on the embodiments shown in the accompanying drawings.

First Embodiment

Figure 1:
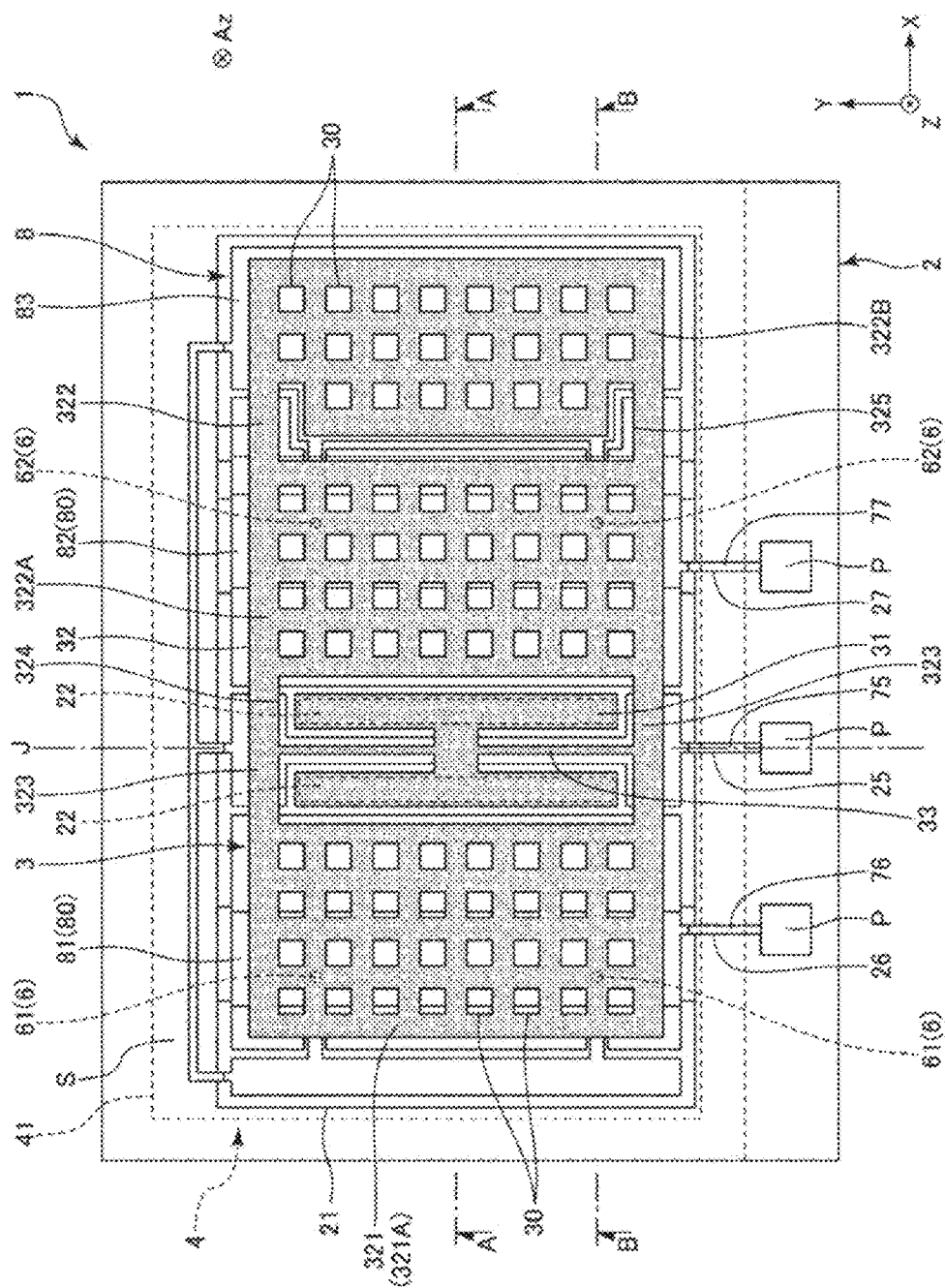
FIG. 1 is a plan view showing a physical quantity sensor according to a first embodiment of the present disclosure.
Figure 2:
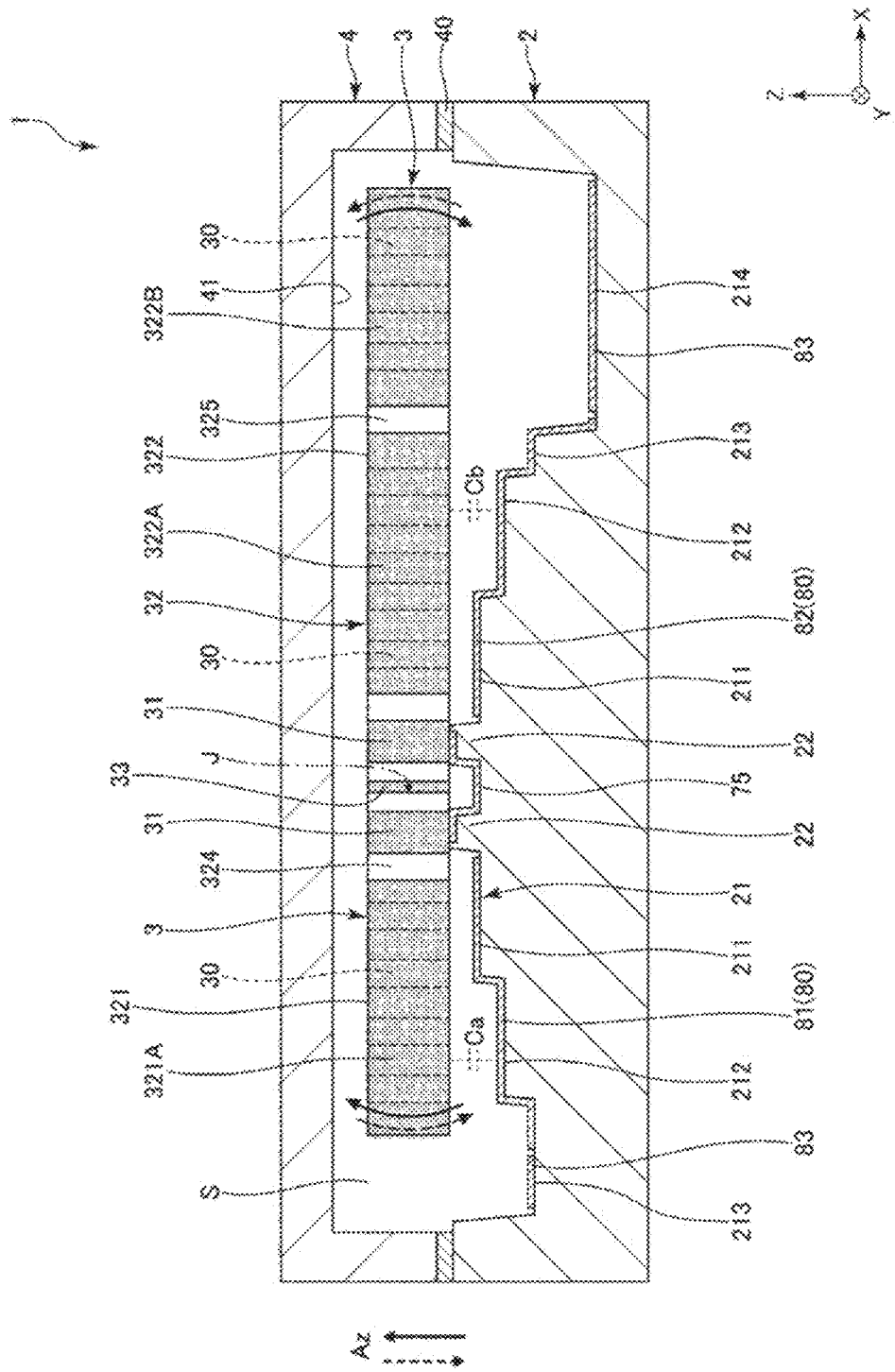
FIG. 2 is a cross-sectional view along the line A-A in FIG. 1.
Figure 3:
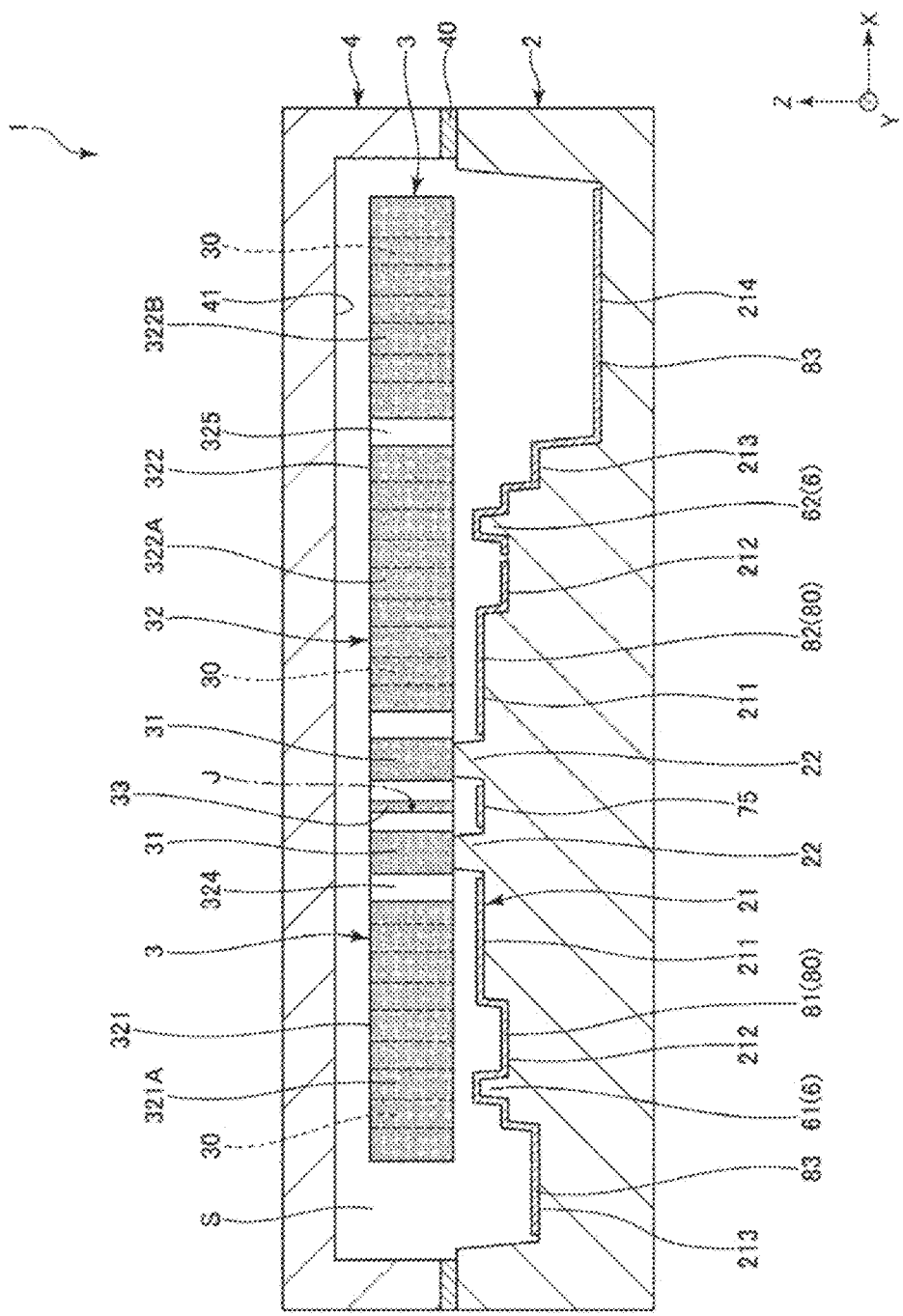
FIG. 3 is a cross-sectional view along the line B-B in FIG. 1.
Figure 4:
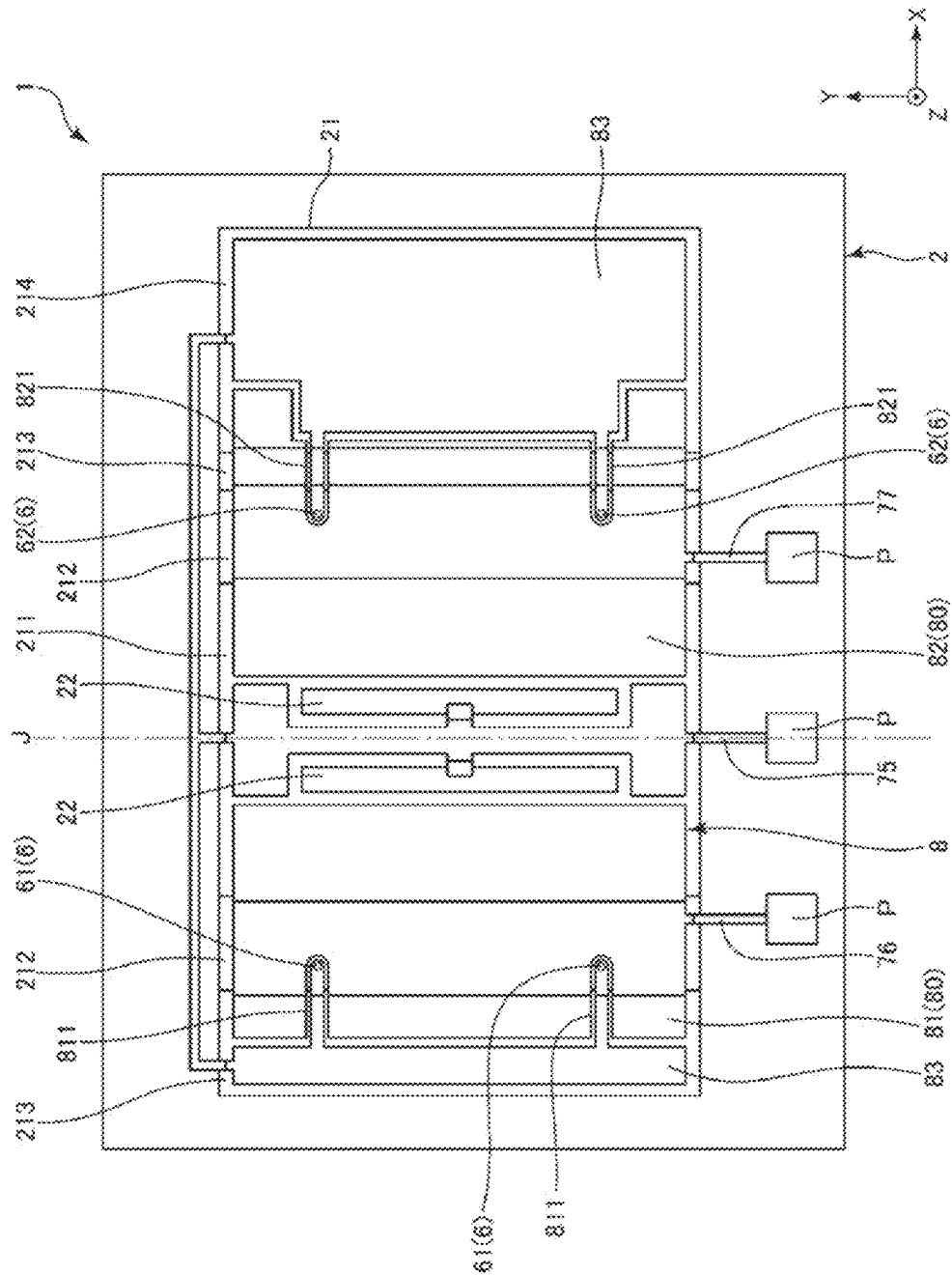
FIG. 4 is a plan view showing electrodes disposed on a bottom surface of a recessed part.
Figure 5:
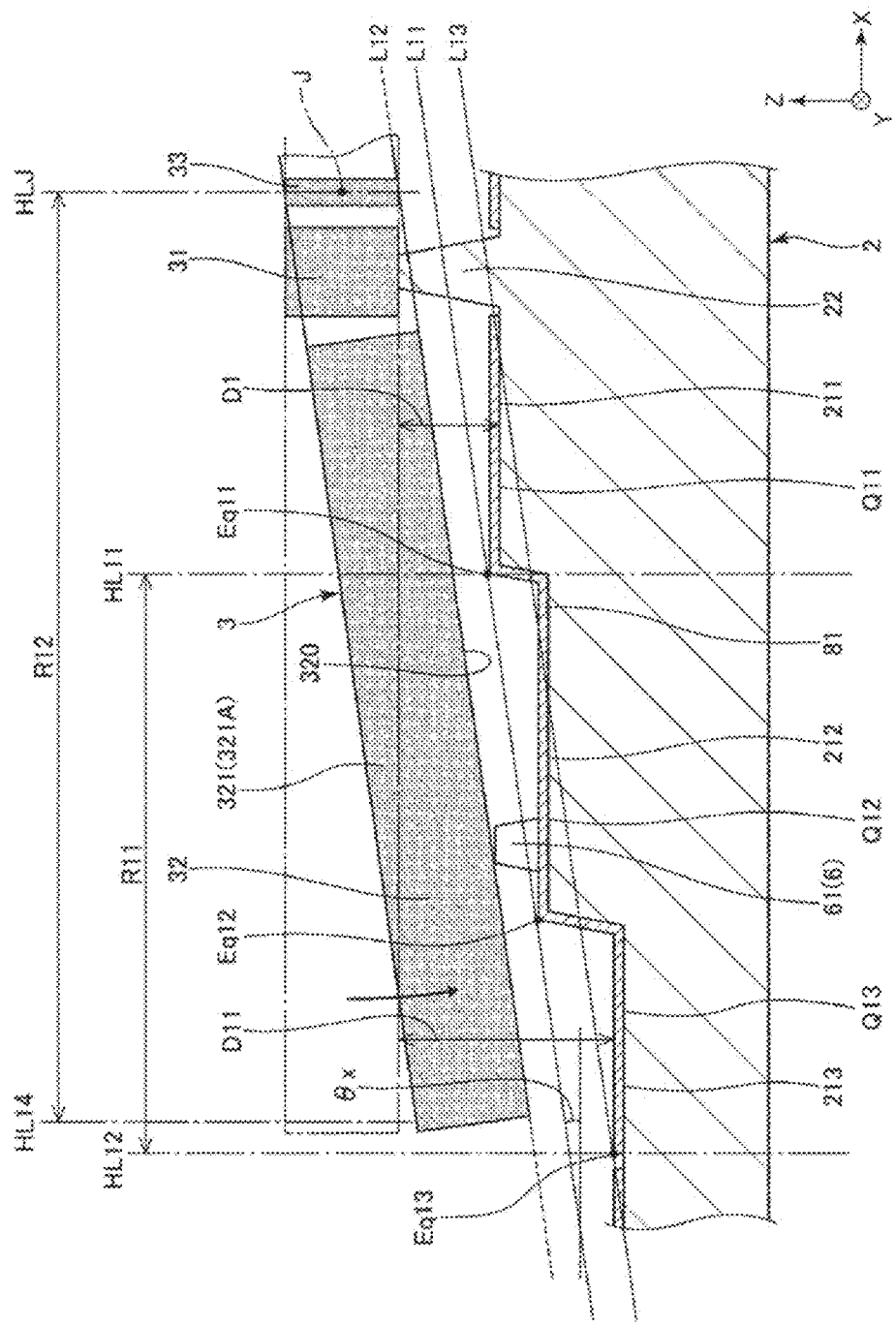
FIG. 5 is a partial enlarged cross-sectional view showing a first detection electrode.
Figure 6:
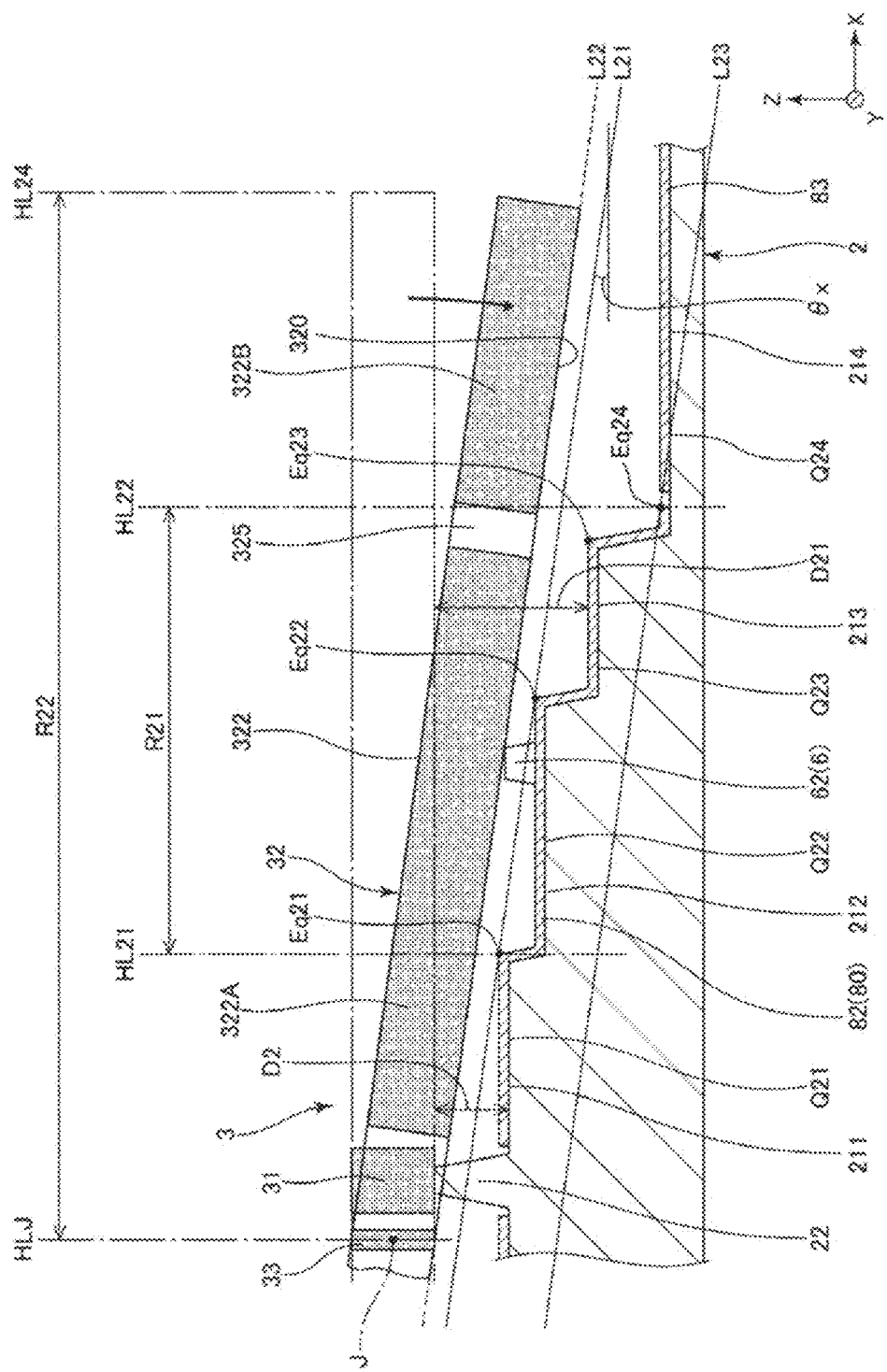
FIG. 6 is a partial enlarged cross-sectional view showing a second detection electrode.

FIG. 1 is a plan view showing a physical quantity sensor according to a first embodiment of the present disclosure. FIG. 2 is a cross-sectional view along the line A-A in FIG. 1. FIG. 3 is a cross-sectional view along the line B-B in FIG. 1. FIG. 4 is a plan view showing electrodes disposed on a bottom surface of a recessed part. FIG. 5 is a partial enlarged cross-sectional view showing a first detection electrode. FIG. 6 is a partial enlarged cross-sectional view showing a second detection electrode. FIGS. 7 through 12 are each a cross-sectional view showing a modified example of the physical quantity sensor shown in FIG. 1. It should be noted that FIG. 7 through FIG. 12 each correspond to a cross-sectional view along the line A-A in FIG. 1.

It should be noted that hereinafter three axes perpendicular to each other are defined as an X axis, a Y axis, and a Z axis, and a direction parallel to the X axis is also referred to as an X-axis direction as a first direction, a direction parallel to the Y axis is also referred to as a Y-axis direction as a second direction, and a direction parallel to the Z axis is also referred to as a Z-axis direction as a third direction for the sake of convenience of explanation. Further, the tip side in the arrow direction of each of the axes is also referred to as a "positive side," and the opposite side is also referred to as a "negative side." Further, the positive side in the Z-axis direction is also referred to as an "upper side," and the negative side in the Z-axis direction is also referred to as a "lower side." Further, a plan view viewed from the Z-axis direction is also referred to simply as a "plan view." Further, in the specification of the present disclosure, "perpendicular" includes when two things cross each other at an angle slightly different from 90° to the extent that the angle can be identified as 90° such as when the two things cross each other at an angle in a range of, for example, 80° through 100° in addition to when the two things cross each other at an angle of 90°. Specifically, it is assumed that "perpendicular" includes when the X axis is tilted as much as −10° through +10° with respect to the normal line of the Y-Z plane, when the Y axis is tilted as much as −10° through +10° with respect to the normal line of the X-Z plane, when the Z axis is tilted as much as −10° through +10° with respect to the normal line of the X-Y plane. Further, a state in which acceleration Az in the Z-axis direction as a detection object is not applied is also referred to as a natural state.

A physical quantity sensor 1 shown in FIG. 1 is an acceleration sensor capable of measuring the acceleration Az in the Z-axis direction. The physical quantity sensor 1 has a substrate 2, an element section 3 disposed on the substrate 2, and a lid body 4 which is bonded to the substrate 2 so as to cover the element section 3.

As shown in FIG. 1, the substrate 2 has a plate-like shape, and has a recessed part 21 opening on an upper surface of the substrate 2. Further, in the plan view, the recessed part 21 is larger than the element section 3, and includes the element section 3 inside. Further, the substrate 2 has groove parts 25, 26, and 27 opening on the upper surface thereof. Further, the substrate 2 has mount parts 22 which is disposed on a bottom surface of the recessed part 21, and which project toward the element section 3. Further, on upper surfaces of the mount parts 22, there is bonded the element section 3.

As the substrate 2, it is possible to use a glass substrate formed of a glass material including alkali metal ions (movable ions such as Na+) such as borosilicate glass such as Pyrex (registered trademark) glass or Tempax (registered trademark) glass. It should be noted that the substrate 2 is not particularly limited, but it is also possible to use, for example, a silicon substrate or a ceramic substrate.

Further, as shown in FIG. 1, the substrate 2 has electrodes 8. The electrodes 8 include detection electrodes 80 and a dummy electrode 83 disposed on the bottom surface of the recessed part 21. Further, the detection electrodes 80 include a first detection electrode 81 and a second electrode 82. Further, the substrate 2 has interconnections 75, 76, and 77 respectively disposed in the grooves 25, 26, 27. Further, one end part of each of the interconnections 75, 76, and 77 is exposed to the outside of the lid body 4, and functions as an electrode pad P for achieving electrical coupling to an external device. Further, the interconnection 75 is electrically coupled to the element section 3 and the dummy electrode 83, the interconnection 76 is electrically coupled to the first detection electrode 81, and the interconnection 77 is electrically coupled to the second detection electrode 82.

As shown in FIG. 2, the lid body 4 has a recessed part 41 opening on a lower surface. Further, the lid body 4 is bonded to the upper surface of the substrate 2 so as to house the element section 3 in the recessed part 41. Thus, a housing space S for housing the element section 3 is formed between the lid body 4 and the substrate 2. The housing space S is an airtight space. Further, in the housing space S, there is encapsulated an inert gas such as nitrogen, helium, or argon, and the housing space S is in substantially atmospheric pressure at the operating temperature in a range of about −40° C. through 120° C. It should be noted that the atmosphere in the housing space S is not particularly limited, and can be, for example, in a reduced-pressure state, or can also be in a pressurized state.

The lid body 4 is formed of, for example, a silicon substrate. It should be noted that the lid body 4 is not particularly limited, and can also be formed of, for example, a glass substrate or a ceramic substrate. Further, a method of bonding the substrate 2 and the lid body 4 is not particularly limited, and can arbitrarily be selected in accordance with materials of the substrate 2 and the lid body 4. It is possible to use, for example, anodic bonding, activation bonding of bonding the bonding surfaces activated by plasma irradiation to each other, bonding with bonding material such as glass frit, or diffusion bonding of bonding the metal films deposited on the upper surface of the substrate 2 and the lower surface of the lid body 4 to each other. In the present embodiment, the substrate 2 and the lid body 4 are bonded to each other via glass flit 40 as low-melting-point glass.

As shown in FIG. 1, the element section 3 has a fixation part 31 bonded to the mount parts 22 with anodic bonding, a movable body 32 shaped like a plate displaceable with respect to the fixation part 31, and support beams 33 for coupling the fixation part 31 and the movable body 32 to each other. When the acceleration Az acts on the physical quantity sensor 1, the movable body 32 makes a seesaw oscillation around an oscillation axis J while causing a torsional deformation in the support beams 33 using the support beams 33 as the oscillation axis J. Such an element section 3 is formed by, for example, patterning a silicon substrate doped with impurities to thereby be provided with electrical conductivity using a processing technology such as dry etching. It should be noted that the material of the element section 3 and a method of forming the element section 3 are not particularly limited.

In the plan view, the movable body 32 has an elongated shape extending along the X-axis direction, and has a rectangular shape having long sides in the X-axis direction in the present embodiment. Further, the movable body 32 has a first mass part 321 located at the negative side in the X-axis direction with respect to the oscillation axis J, a second mass part 322 located at the positive side in the X-axis direction with respect to the oscillation axis J, and coupling parts 323 which are located between the first mass part 321 and the second mass part 322, and which couple the first mass part 321 and the second mass part 322 to each other. Further, the movable body 32 is coupled to the support beams 33 in the respective coupling parts 323.

The first mass part 321 is formed of a first detection part 321A. In contrast, the second mass part 322 is longer in the X-axis direction than the first mass part 321, and is higher in rotational moment, namely torque, when the acceleration Az is applied than the first mass part 321. The seesaw oscillation described above becomes possible due to this difference in rotational moment. Such a second mass part 322 has a second detection part 322A and a torque generation part 322B, wherein the second detection part 322A is a base end part of the second mass part 322, and is a portion symmetric with the first detection part 321A about the oscillation axis J in the plan view, and the torque generation part 322B is a tip part of the second mass part 322, and is a portion asymmetric with the first detection part 321A about the oscillation axis J.

Further, the movable body 32 has an opening 324 located between the first detection part 321A and the second detection part 322A. Further, the fixation part 31 and the support beams 33 are disposed in the opening 324. Further, the support beams 33 extend along the Y-axis direction to form the oscillation axis J. It should be noted that the arrangement of the fixation part 31 and the support beams 33 is not particularly limited, and can be disposed, for example, outside the movable body 32.

Further, the movable body 32 is provided with a plurality of fine through holes 30. Due to the through holes 30, it is possible to reduce dumping generated between the movable body 32 and the substrate 2, and adjust the degree of the dumping. Further, on the boundary between the second detection part 322A and the torque generation part 322B in the second mass part 322, there is formed a through hole 325 extending in the Y-axis direction. By forming the through hole 325, it is possible to reduce an "unwanted electrostatic attractive force" described later and generated between the recessed part 21 and the movable body 32.

Here, the description returns to the explanation of the electrodes 8 disposed in the recessed part 21. As shown in FIG. 1, the first detection electrode 81 is disposed so as to overlap the first detection part 321A in the plan view. Further, the second detection electrode 82 is disposed so as to overlap the second detection part 322A in the plan view. Further, a portion of the first detection electrode 81 overlapping the first detection part 321A and a portion of the second detection electrode 82 overlapping the second detection part 322A are disposed symmetrically about the oscillation axis J, more specifically, the Y-Z plane crossing the oscillation axis J.

Further, the dummy electrode 83 is disposed so as to spread in a substantially entire area in which neither the first detection electrode 81 nor the second detection electrode 82 is disposed out of the bottom surface of the recessed part 21. Specifically, the dummy electrode 83 has a portion which is located at the positive side in the X-axis direction of the second detection electrode 82, and which is disposed so as to overlap the torque generation part 322B in the plan view, and a portion which is disposed at the negative side in the X-axis direction of the first detection electrode 81. By providing the dummy electrode 83, it is possible to prevent the bottom surface of the recessed part 21 from being electrostatically charged due to the migration of the alkali metal ions in the substrate 2. Therefore, it is possible to effectively prevent an unwanted electrostatic attractive force which causes an erroneous operation of the movable body 32, in particular, the displacement by another external force than the acceleration Az as the detection object, from being generated between the bottom surface of the recessed part 21 and the movable body 32. Therefore, there is obtained the physical quantity sensor 1 high in detection accuracy of the acceleration Az.

When driving the physical quantity sensor 1, a predetermined drive voltage is applied to the element section 3, and the first detection electrode 81 and the second detection electrode 82 are each coupled to a QV amplifier (a charge-to-voltage conversion circuit). Thus, as shown in FIG. 2, a capacitance Ca is formed between the first detection electrode 81 and the first detection part 321A, a capacitance Cb is formed between the second detection electrode 82 and the second detection part 322A of the second mass part 322. When the acceleration Az is applied to the physical quantity sensor 1, due to the difference in rotational moment between the first and second mass parts 321, 322, the movable body 32 makes the seesaw oscillation centering on the oscillation axis J while making the support beams 33 deform torsionally. Due to such a seesaw oscillation of the movable body 32, a gap between the first detection part 321A and the first detection electrode 81 and a gap between the second mass part 322 and the second detection electrode 82 vary in reversed phase from each other, and accordingly, the capacitances Ca, Cb vary in reversed phase from each other. Therefore, it is possible to detect the acceleration Az based on the variation in the capacitances Ca, Cb.

In particular, in the present embodiment, as described above, the first detection part 321A and the second detection part 322A are symmetric about the oscillation axis J, and further, the portion of the first detection electrode 81 overlapping the first detection part 321A and the portion of the second detection electrode 82 overlapping the second detection part 322A are symmetric about the oscillation axis J. Therefore, the capacitances Ca, Cb are equal to each other in the natural state in which the acceleration Az is not applied. As a result, the natural state becomes a "zero point" at which the output vanishes, and a zero point correction for setting the zero point to the natural state becomes unnecessary. Therefore, the device configuration of the physical quantity sensor 1 becomes simple. Further, since the capacitances Ca, Cb are the same in variation when performing the seesaw oscillation, it is possible to accurately detect the acceleration Az based on the differential operation of the capacitances Ca, Cb varying in reversed phase.

Further, as shown in FIG. 1, FIG. 3, and FIG. 4, the physical quantity sensor 1 has protrusions 6 protruding from the bottom surface of the recessed part 21 toward the movable body 32. When an excessive oscillation occurs in the movable body 32, the protrusions 6 each make contact with the movable body 32 to thereby function as a stopper for limiting the further oscillation of the movable body 32. By disposing the protrusions 6, the excessive oscillation of the movable body 32 is prevented, and it is possible to effectively prevent the breakage and damage of the element section 3. Further, it is also possible to prevent an excessive approach or contact in large area between the movable body 32 and the first, second detection electrodes 81, 82 different in electrical potential from each other. Therefore, it is possible to prevent occurrence of so-called "sticking" in which the movable body 32 is not restored from a state of being attracted by the first detection electrode 81 or the second detection electrode 82 due to the electrostatic attractive force generated between the movable body 32 and the first, second detection electrodes 81, 82. It should be noted that although the protrusions 6 are integrally formed with the substrate 2 in the present embodiment, this is not a limitation, and it is possible for the protrusions 6 to be formed separately from the substrate 2.

In the plan view, the protrusions 6 include protrusions 61 overlapping the first detection part 321A and protrusions 62 overlapping the second detection part 322A. Out of these protrusions 6, the protrusions 61 limit the excessive oscillation of the movable body 32 toward the first detection electrode 81, and the protrusions 62 limit the excessive oscillation of the movable body 32 toward the second detection electrode 82. Further, the protrusions 61, 62 are each disposed as a pair arranged in the Y-axis direction.

Further, as shown in FIG. 3 and FIG. 4, each of the protrusions 61, 62 is covered with the dummy electrode 83 at the same electrical potential as that of the movable body 32. Therefore, each of the protrusions 61, 62 is the same in electrical potential as the movable body 32. Thus, it is possible to prevent the surface of each of the protrusions 61, 62 from being electrostatically charged due to the migration of the alkali metal ions in the substrate 2. Therefore, it is possible to effectively prevent the occurrence of the "unwanted electrostatic attractive force" described above between the protrusions 61, 62 and the movable body 32. Therefore, there is obtained the physical quantity sensor 1 high in detection accuracy of the acceleration Az.

It should be noted that in the present embodiment, as shown in FIG. 4, the first detection electrode 81 is provided with a pair of cutouts 811 extending from the outer edge to the respective protrusions 61, and the dummy electrode 83 is made to extend in the cutouts 811 to thereby cover the protrusions 61. Similarly, the second detection electrode 82 is provided with a pair of cutouts 821 extending from the outer edge to the respective protrusions 62, and the dummy electrode 83 is made to extend in the cutouts 821 to thereby cover the protrusions 62. Thus, it is possible to cover the protrusions 61, 62 with the dummy electrode 83 with a relatively simple configuration. It should be noted that the method of covering the protrusions 61, 62 with the dummy electrode 83 is not particularly limited.

It should be noted that the configuration of the protrusions 6 is not particularly limited. For example, the number of each of the protrusions 61, 62 can be 1, or can also be 3 or more. Further, it is possible for the protrusions 61 to be covered with the first detection electrode 81, or to be exposed without being covered with an electrode. Similarly, it is possible for the protrusions 62 to be covered with the second detection electrode 82, or to be exposed without being covered with an electrode. Further, it is possible for each of the protrusions 61, 62 to protrude from a lower surface 320 of the movable body 32 toward the substrate 2.

Further, the protrusions 6 can also be omitted. When omitting the protrusions 6, it is possible to arrange that, for example, the further oscillation of the movable body 32 toward the first detection electrode 81 is limited by the tip of the first mass part 321 making contact with the dummy electrode 83 on a third recessed part 213, and the further oscillation of the movable body 32 toward the second detection electrode 82 is limited by the tip of the second mass part 322 making contact with the dummy electrode 83 on a fourth recessed part 214.

Hereinabove, the configuration of the physical quantity sensor 1 is briefly described. Then, the recessed part 21 will be described in detail. As shown in FIG. 2 and FIG. 3, the recessed part 21 has a multistep shape formed of a plurality of recessed parts, the four recessed parts in the present embodiment. Specifically, the recessed part 21 has a first recessed part 211 which is the shallowest of all, a second recessed part 212 which is located at both sides in the X-axis direction of the first recessed part 211, and which is deeper than the first recessed part 211, the third recessed part 213 which is located at both sides in the X-axis direction of the second recessed part 212, and which is deeper than the second recessed part 212, and the fourth recessed part 214 which is located at the positive side in the X-axis direction of the third recessed part 213, and which is deeper than the third recessed part 213. In other words, the bottom surface of the recessed part 21 is provided with the stepped surface in which the farther a part of the bottom surface of the recessed part 21 is from the oscillation axis J, the longer the separation distance between the movable body 32 and that part of the recessed part 21 is.

Then, the configuration of the first detection electrode 81 will be described in detail. As shown in FIG. 5, in the negative side in the X-axis direction with respect to the oscillation axis J, the substrate 2 has a first area Q11 formed of a bottom surface of the first recessed part 211, a second area Q12 formed of a bottom surface of the second recessed part 212, and a third area Q13 as an m-th area formed of a bottom surface of the third recessed part 213. Further, the first detection electrode 81 is disposed on the first area Q11, the second area Q12, and the third area Q13 as an n-th area. It should be noted that m and n are both an integer no smaller than 2, and fulfill n≤m. Here, n=3 and m=3 are assumed.

The first area Q11 through the third area Q13 are arranged in sequence from the side near to the oscillation axis J, and are each opposed to the movable body 32 with a gap. Further, a separation distance D1 from the movable body 32 increases in the order of the first area Q11 to the third area Q13. Thus, it is possible to arrange the first detection electrode 81 shifted toward the movable body 32 as a whole while preventing the contact with the movable body 32. Therefore, it is possible to decrease the average separation distance between the movable body 32 and the first detection electrode 81 to increase the capacitance Ca. As a result, it is possible to improve the sensitivity of the physical quantity sensor 1 in detecting the acceleration Az.

Further, in the cross-sectional view from the Y-axis direction, there are assumed imaginary straight lines connecting any two of the end parts at the farther side from the oscillation axis J of the first area Q11, the second area Q12, and the third area Q13 of the first detection electrode 81, and the imaginary straight line the smallest in an angle θx formed with the X axis is defined as a first imaginary straight line L11. In other words, out of the imaginary straight lines connecting two selected from an end part Eq11 at the negative side in the X-axis direction of the first detection electrode 81 on the first area Q11, an end part Eq12 at the negative side in the X-axis direction of the first detection electrode 81 on the second area Q12, an end part Eq13 at the negative side in the X-axis direction of the first detection electrode 81 on the third area Q13, the imaginary straight line which is the smallest in the angle θx formed with the X axis is defined as the first imaginary straight L11. In the illustrated configuration, the imaginary straight line touching the end parts Eq11, Eq12 becomes the first imaginary straight line L11. It should be noted that this is not a limitation, and it is possible for the imaginary straight line touching the end parts Eq11, Eq13 to be the first imaginary straight line L11, or it is possible for the imaginary straight line touching the end parts Eq12, Eq13 to be the first imaginary straight line L11.

Further, in the cross-sectional view from the Y-axis direction, the imaginary straight line extending along the lower surface 320 of the movable body 32 in the state in which the movable body 32 makes the maximum displacement toward the first detection electrode 81 around the oscillation axis J is defined as a second imaginary straight line L12. It should be noted that the "state in which the movable body 32 makes the maximum displacement" described above means the state in which the movable body 32 makes contact with the protrusions 61, and thus, the further oscillation toward the first detection electrode 81 is restricted.

Further, a normal line which passes the end part Eq11 closest to the oscillation axis J out of the end parts Eq11 through Eq13, and which extends in the Z-axis direction is defined as a first normal line HL11, a normal line which passes the farthest end part Eq13 from the oscillation axis J, and which extends in the Z-axis direction is defined as a second normal line HL12, and an area between the first normal line HL11 and the second normal line HL12 is defined as an area R11. Further, in the physical quantity sensor 1, the first imaginary straight line L11 and the second imaginary straight line L12 do not cross each other in the area R11 in the cross-sectional view from the Y-axis direction. Thus, it is possible to arrange the first detection electrode 81 shifted toward the movable body 32 as a whole while preventing sticking of the movable body 32. Therefore, it is possible to decrease the average separation distance between the movable body 32 and the first detection electrode 81 to increase the capacitance Ca. As a result, it is possible to improve the sensitivity of the physical quantity sensor 1 in detecting the acceleration Az.

In particular, in the present embodiment, the first imaginary straight line L11 and the second imaginary straight light L12 do not cross each other in an area R12 between a third normal line HLJ which crosses the oscillation axis J, and which extends in the Z-axis direction, and a fourth normal line HL14 which passes an end part at the negative side in the X-axis direction of the movable body 32, and which extends in the Z-axis direction in the cross-sectional view from the Y-axis direction. Thus, the angle formed between the first normal line HL11 and the second normal line HL12 becomes smaller, and the advantage described above becomes more conspicuous. In other words, it is possible to arrange the first detection electrode 81 further shifted toward the movable body 32 as a whole while preventing sticking of the movable body 32. Therefore, it is possible to further improve the sensitivity of the physical quantity sensor 1 in detecting the acceleration Az.

Further, in the cross-sectional view from the Y-axis direction, when setting a third imaginary straight line L13 which touches the end part Eq13 the farthest from the oscillation axis J out of the end parts Eq11 through Eq13, and which is parallel to the second imaginary straight line L12, the other end parts Eq11, Eq12 are all located between the second imaginary straight line L12 and the third imaginary straight line L13. Thus, it is possible to arrange the first detection electrode 81 further shifted toward the movable body 32 as a whole while preventing the contact between each of the end parts Eq11 through Eq13 and the movable body 32. Therefore, it is possible to further improve the sensitivity of the physical quantity sensor 1 in detecting the acceleration Az. It should be noted that this is not a limitation, and it is possible for at least one of the end parts Eq11, Eq12 to be located at the lower side of the third imaginary straight line L13.

Further, a separation distance D11 between the first detection part 321A and the first detection electrode 81 is preferably no larger than 3.5 μm, and more preferably no larger than 2.5 μm. Thus, the separation distance D1 becomes sufficiently small. Therefore, the capacitance Ca becomes sufficiently high, and it is possible to sufficiently increase the sensitivity of the physical quantity sensor 1 in detecting the acceleration Az. It should be noted that the separation distance D11 mentioned here means the largest separation distance between the first detection part 321A and the first detection electrode 81 in a portion overlapping the first detection part 321A.

The first detection electrode 81 is hereinabove described. Then, the configuration of the second detection electrode 82 will be described. The second detection electrode 82 is substantially the same in configuration as the first detection electrode 81. In the positive side in the X-axis direction with respect to the oscillation axis J, the substrate 2 has a first area Q21 formed of the bottom surface of the first recessed part 211, a second area Q22 formed of the bottom surface of the second recessed part 212, and a third area Q23 formed of the bottom surface of the third recessed part 213, and a fourth area Q24 as an m-th area formed of a bottom surface of the fourth recessed part 214. Further, the second detection electrode 82 is disposed on the first area Q21, the second area Q22, the third area Q23, and the fourth area Q24 as an n-th area. It should be noted that m and n are both an integer no smaller than 2, and fulfill n≤m. Here, n=4 and m=4 are assumed.

Further, the first area Q21 through the fourth area Q24 are arranged in sequence from the side near to the oscillation axis J, and are each opposed to the movable body 32 with a gap. Further, a separation distance D2 from the movable body 32 increases in the order of the first area Q21 to the fourth area Q24. Thus, it is possible to arrange the second detection electrode 82 shifted toward the movable body 32 as a whole while preventing the contact with the movable body 32. Therefore, it is possible to decrease the average separation distance between the movable body 32 and the second detection electrode 82 to increase the capacitance Cb. As a result, it is possible to improve the sensitivity of the physical quantity sensor 1 in detecting the acceleration Az.

Further, in the cross-sectional view from the Y-axis direction, there are assumed imaginary straight lines connecting any two of the end parts at the farther side from the oscillation axis J of the first area Q21, the second area Q22, the third area Q23, and the fourth area Q24 of the second detection electrode 82, and the imaginary straight line the smallest in the angle θx formed with the X axis is defined as a first imaginary straight line L21. In other words, out of the imaginary straight lines connecting two selected from an end part Eq21 at the positive side in the X-axis direction of the second detection electrode 82 on the first area Q21, an end part Eq22 at the positive side in the X-axis direction of the second detection electrode 82 on the second area Q22, an end part Eq23 at the positive side in the X-axis direction of the second detection electrode 82 on the third area Q23, an end part Eq24 at the positive side in the X-axis direction of the second detection electrode 82 on the fourth area Q24, the imaginary straight line which is the smallest in the angle θx formed with the X axis is defined as the first imaginary straight L21. In the illustrated configuration, the imaginary straight line touching the end parts Eq21, Eq22 becomes the first imaginary straight line L21. It should be noted that this is not a limitation, and it is possible for the imaginary straight line touching the end parts Eq21, Eq23 to be the first imaginary straight line L21, or it is possible for the imaginary straight line touching the end parts Eq22, Eq23 to be the first imaginary straight line L21.

Further, in the cross-sectional view from the Y-axis direction, the imaginary straight line extending along the lower surface 320 of the movable body 32 in the state in which the movable body 32 makes the maximum displacement toward the second detection electrode 82 around the oscillation axis J is defined as a second imaginary straight line L22. It should be noted that the "state in which the movable body 32 makes the maximum displacement" described above means the state in which the movable body 32 makes contact with the protrusions 62, and thus, the further oscillation toward the second detection electrode 82 is restricted.

Further, a normal line which passes the end part Eq21 closest to the oscillation axis J out of the end parts Eq21 through Eq24, and which extends in the Z-axis direction is defined as a first normal line HL21, a normal line which passes the farthest end part Eq24 from the oscillation axis J, and which extends in the Z-axis direction is defined as a second normal line HL22, and an area between the first normal line HL21 and the second normal line HL22 is defined as an area R21. Further, in the physical quantity sensor 1, the first imaginary straight line L21 and the second imaginary straight line L22 do not cross each other in the area R21 in the cross-sectional view from the Y-axis direction. Thus, it is possible to arrange the second detection electrode 82 shifted toward the movable body 32 as a whole while preventing sticking of the movable body 32. Therefore, it is possible to decrease the average separation distance between the movable body 32 and the second detection electrode 82 to increase the capacitance Cb. As a result, it is possible to improve the sensitivity of the physical quantity sensor 1 in detecting the acceleration Az.

In particular, in the present embodiment, the first imaginary straight line L21 and the second imaginary straight light L22 do not cross each other in an area R22 between the third normal line HLJ which crosses the oscillation axis J, and which extends in the Z-axis direction, and a fourth normal line HL24 which passes an end part at the positive side in the X-axis direction of the movable body 32, and which extends in the Z-axis direction in the cross-sectional view from the Y-axis direction. Thus, the angle formed between the first imaginary straight line L21 and the second imaginary straight line L22 becomes smaller, and the advantage described above becomes more conspicuous. In other words, it is possible to arrange the second detection electrode 82 further shifted toward the movable body 32 as a whole while preventing sticking of the movable body 32. Therefore, it is possible to further improve the sensitivity of the physical quantity sensor 1 in detecting the acceleration Az.

Further, in the cross-sectional view from the Y-axis direction, when setting a third imaginary straight line L23 which touches the end part Eq24 the farthest from the oscillation axis J out of the end parts Eq21 through Eq24, and which is parallel to the second imaginary straight line L22, the other end parts Eq21, Eq22, and Eq23 are all located between the second imaginary straight line L22 and the third imaginary straight line L23. Thus, it is possible to arrange the second detection electrode 82 further shifted toward the movable body 32 as a whole while preventing the contact between each of the end parts Eq21 through Eq24 and the movable body 32. Therefore, it is possible to further improve the sensitivity of the physical quantity sensor 1 in detecting the acceleration Az. It should be noted that this is not a limitation, and it is possible for at least one of the end parts Eq21, Eq22, and Eq23 to be located at the lower side of the third imaginary straight line L23.

Further, a separation distance D21 between the second detection part 322A and the second detection electrode 82 is preferably no larger than 3.5 μm, and more preferably no larger than 2.5 μm. Thus, the separation distance D21 becomes sufficiently small. Therefore, the capacitance Cb becomes sufficiently high, and it is possible to sufficiently increase the sensitivity of the physical quantity sensor 1 in detecting the acceleration Az. It should be noted that the separation distance D21 mentioned here means the largest separation distance between the second detection part 322A and the second detection electrode 82 in a portion overlapping the second detection part 322A.

The physical quantity sensor 1 is described hereinabove. As described above, when assuming the three directions perpendicular to each other as the X-axis direction as the first direction, the Y-axis direction as the second direction, and the Z-axis direction as the third direction, such a physical quantity sensor 1 has the substrate 2, the movable body 32 which is opposed to the substrate 2 in the Z-axis direction with a gap, and which oscillates around the oscillation axis J along the Y-axis direction with respect to the substrate 2, and the first detection electrode 81 as the detection electrodes 80 disposed so as to be opposed to the movable body. Further, the substrate 2 has the first area Q11 through the third area Q13 as the m-th area (m is an integer no smaller than 2) disposed in sequence from a side near to the oscillation axis J, the first area Q11 through the third area Q13 are each opposed to the movable body 32 with a gap, and the first detection electrode 81 is disposed so as to straddle the first area Q11 through the third area Q13 as the n-th area (n is an integer no smaller than 2, and fulfills n≤m. Further, in the cross-sectional view from the Y-axis direction, when setting the first imaginary straight line L11 the smallest in the angle θx formed with the X-axis direction out of the imaginary straight lines connecting two of the end parts Eq11 through Eq13 located at the far side from the oscillation axis J on the respective areas of the first area Q11 through the third area Q13 of the first detection electrode 81, and the second imaginary straight line L12 extending along the lower surface 320 as the principal surface at the substrate 2 side of the movable body 32 in the state in which the movable body 32 makes the maximum displacement around the oscillation axis J, the first imaginary straight line L11 and the second imaginary straight line L12 do not cross each other in the area R11 between the first normal line HL11 which passes the end part Eq11 of the first area Q11, and which extends in the Z-axis direction, and the second normal line HL12 which passes the end part Eq13 of the third area Q13, and which extends in the Z-axis direction.

Thus, it is possible to arrange the first detection electrode 81 shifted toward the movable body 32 as a whole while preventing sticking of the movable body 32. Therefore, it is possible to decrease the average separation distance between the movable body 32 and the first detection electrode 81 to increase the capacitance Ca. As a result, it is possible to improve the sensitivity of the physical quantity sensor 1 in detecting the acceleration Az.

Further, as described above, the physical quantity sensor 1 has the second detection electrode 82 as the detection electrodes 80 disposed so as to be opposed to the movable body 32. Further, the substrate 2 has the first area Q21 through the fourth area Q24 as the m-th area (m is an integer no smaller than 2) disposed in sequence from a side near to the oscillation axis J, the first area Q21 through the fourth area Q24 are each opposed to the movable body 32 with a gap, and the second detection electrode 82 is disposed so as to straddle the first area Q21 through the fourth area Q24 as the n-th area (n is an integer no smaller than 2, and fulfills n≤m). Further, in the cross-sectional view from the Y-axis direction, when setting the first imaginary straight line L21 the smallest in the angle θx formed with the X-axis direction out of the imaginary straight lines connecting two of the end parts Eq21 through Eq24 located at the far side from the oscillation axis J on the respective areas of the first area Q21 through the fourth area Q24 of the second detection electrode 82, and the second imaginary straight line L22 extending along the lower surface 320 as the principal surface at the substrate 2 side of the movable body 32 in the state in which the movable body 32 makes the maximum displacement around the oscillation axis J, the first imaginary straight line L21 and the second imaginary straight line L22 do not cross each other in the area R21 between the first normal line HL21 which passes the end part Eq21 of the first area Q21, and which extends in the Z-axis direction, and the second normal line HL22 which passes the end part Eq24 of the fourth area Q24, and which extends in the Z-axis direction.

Thus, it is possible to arrange the second detection electrode 82 shifted toward the movable body 32 as a whole while preventing sticking of the movable body 32. Therefore, it is possible to decrease the average separation distance between the movable body 32 and the second detection electrode 82 to increase the capacitance Cb. As a result, it is possible to improve the sensitivity of the physical quantity sensor 1 in detecting the acceleration Az.

Further, as described above, in the cross-sectional view from the Y-axis direction, the first imaginary straight line L11 and the second imaginary straight light L12 do not cross each other in the area R12 between the third normal line HLJ which crosses the oscillation axis J, and which extends in the Z-axis direction, and the fourth normal line HL14 which passes the end part at the first detection electrode 81 side of the movable body 32, and which extends in the Z-axis direction. Thus, the angle formed between the first imaginary straight line L11 and the second imaginary straight line L12 becomes smaller, and it is possible to dispose the first detection electrode 81 further shifted as a whole toward the movable body 32. Therefore, it is possible to further improve the sensitivity of the physical quantity sensor 1 in detecting the acceleration Az.

Further, as described above, in the cross-sectional view from the Y-axis direction, the first imaginary straight line L21 and the second imaginary straight light L22 do not cross each other in the area R22 between the third normal line HLJ which crosses the oscillation axis J, and which extends in the Z-axis direction, and the fourth normal line HL24 which passes the end part at the second detection electrode 82 side of the movable body 32, and which extends in the Z-axis direction. Thus, the angle formed between the first imaginary straight line L21 and the second imaginary straight line L22 becomes smaller, and it is possible to dispose the second detection electrode 82 further shifted as a whole toward the movable body 32. Therefore, it is possible to further improve the sensitivity of the physical quantity sensor 1 in detecting the acceleration Az.

Further, as described above, the movable body 32 has the first detection part 321A and the detection part 322A disposed symmetrically about the oscillation axis J, the detection electrodes 80 include the first detection electrode 81 overlapping the first detection part 321A, and the second detection electrode 82 overlapping the second detection part 322A. Further, the first detection electrode 81 and the second detection electrode 82 are disposed symmetrically about the oscillation axis J. Therefore, it is possible to make the capacitances Ca, Cb equal to each other in the natural state in which the acceleration Az is not applied. As a result, the natural state becomes a "zero point" at which the output vanishes, and a zero point correction for setting the zero point to the natural state becomes unnecessary. Therefore, the device configuration of the physical quantity sensor 1 becomes simple. Further, it is possible to detect the acceleration Ax based on the differential operation of the capacitances Ca, Cb varying in reversed phase from each other, and it is possible to improve the sensitivity in detecting the acceleration Az.

There are included the protrusions 6 each protrude from the substrate 2 to make contact with the movable body 32 to thereby limit the oscillation of the movable body 32 around the oscillation axis J. Thus, it is possible to restrict the excessive oscillation of the movable body 32. Further, it is possible to prevent an excessive approach or contact in large area between the movable body 32 and the first, second detection electrodes 81, 82 different in electrical potential from each other. Therefore, sticking of the movable body 32 can effectively be prevented.

Further, as described above, the "state in which the movable body 32 makes the maximum displacement" described above corresponds to the state in which the movable body 32 has contact with the protrusions 6. Thus, sticking of the movable body 32 can effectively be prevented.

Further, as described above, each of the protrusions 6 is the same in electrical potential as the movable body 32. Thus, it is possible to effectively prevent an unwanted electrostatic attractive force which causes an erroneous operation of the movable body 32, in particular, the displacement by another external force than the acceleration Az as the detection object, from being generated between the protrusions 6 and the movable body 32. Therefore, there is obtained the physical quantity sensor 1 high in detection accuracy of the acceleration Az.

Further, as described above, the physical quantity sensor 1 has the dummy electrode 83 which is disposed in a portion of the substrate 2 opposed to the movable body 32 as an area where the detection electrodes 80 are not disposed, and which is the same in electrical potential as the movable body 32. Thus, it is possible to effectively prevent an unwanted electrostatic attractive force which causes an erroneous operation of the movable body 32, in particular, the displacement by another external force than the acceleration Az as the detection object, from being generated between the substrate 2 and the movable body 32. Therefore, there is obtained the physical quantity sensor 1 high in detection accuracy of the acceleration Az.

Further, as described above, the separation distance from the movable body 32 increases in the order of the first area Q11 to the third area Q13. Thus, it is possible to arrange the first detection electrode 81 shifted toward the movable body 32 as a whole while preventing the contact with the movable body 32. Similarly, the separation distance from the movable body 32 increases in the order of the first area Q21 to the fourth area Q24. Thus, it is possible to arrange the second detection electrode 82 shifted toward the movable body 32 as a whole while preventing the contact with the movable body 32.

Further, as described above, the separation distances D11, D21 between the detection electrodes 80 and the movable body 32 are each preferably no larger than 3.5 μm, and more preferably no larger than 2.5 μm. Thus, it is possible to sufficiently shorten the separation distances between the detection electrodes 80 and the movable body 32. Therefore, it is possible to sufficiently improve the sensitivity of the physical quantity sensor 1 in detecting the acceleration Az.

Figure 7:
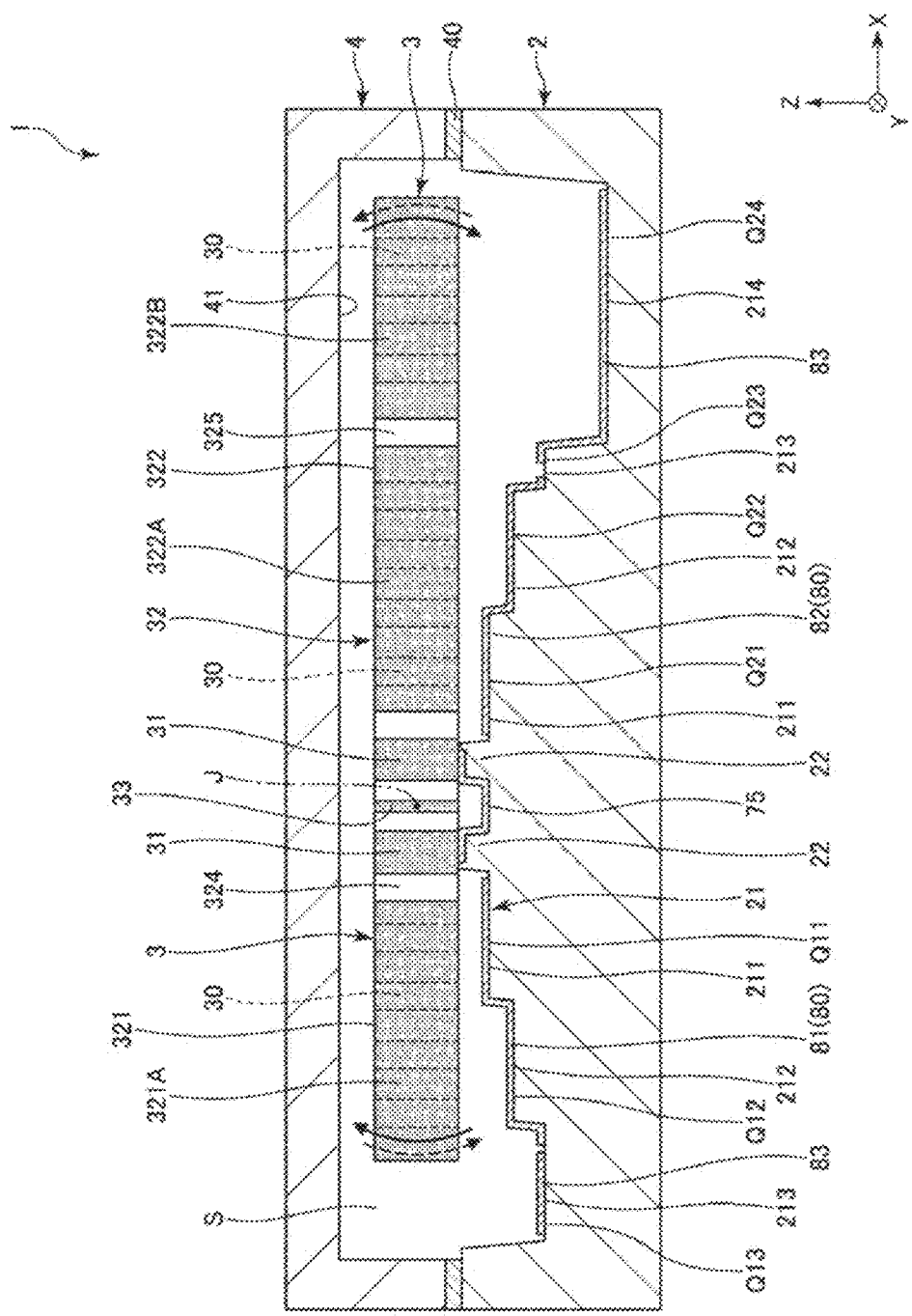
FIG. 7 is a cross-sectional view showing a modified example of the physical quantity sensor shown in FIG. 1.

It should be noted that the configuration of the physical quantity sensor 1, in particular, the configuration of the recessed part 21 and the detection electrodes 80 are not particularly limited. For example, it is also possible to adopt a configuration in which the first detection electrode 81 is disposed so as to straddle the first area Q11, the second area Q12, and the third area Q13, and the second detection electrode 82 is disposed so as to straddle the first area Q21, the second area Q22, and the third area Q23 as shown in FIG. 7. In this configuration, the third area Q13 and the fourth area Q24 each correspond to the m-th area, and the third areas Q13, Q23 each correspond to the n-th area.

Figure 8:
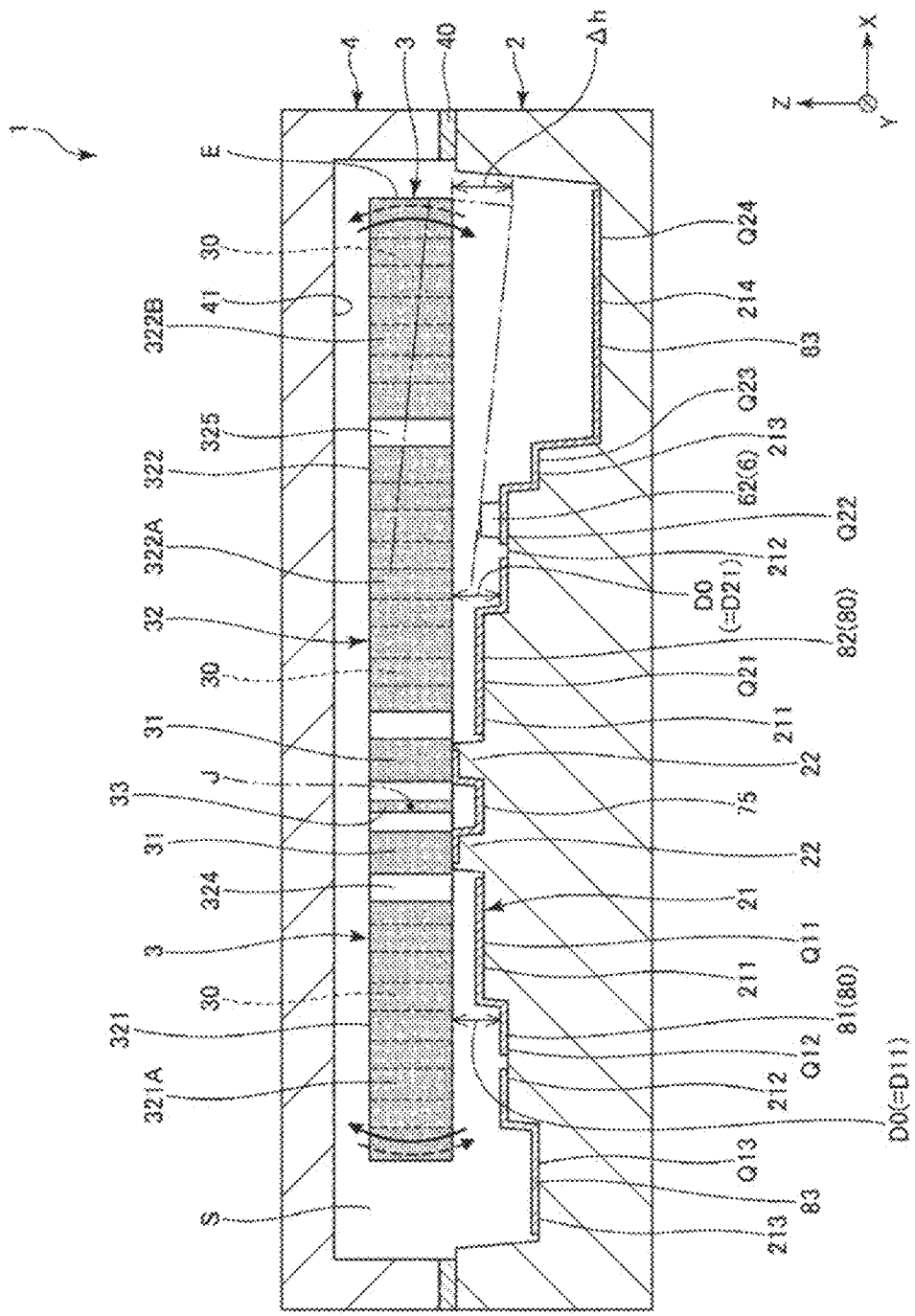
FIG. 8 is a cross-sectional view showing a modified example of the physical quantity sensor shown in FIG. 1.

Further, for example, it is also possible to adopt a configuration in which the first detection electrode 81 is disposed so as to straddle the first area Q11 and the second area Q12, and the second detection electrode 82 is disposed so as to straddle the first area Q21 and the second area Q22 as shown in FIG. 8. In this configuration, the third area Q13 and the fourth area Q24 each correspond to the m-th area, and the second areas Q12, Q22 each correspond to the n-th area.

It should be noted that in the configuration shown in FIG. 8, a separation distance D0 (=D11, D21) between the first, second detection electrodes 81, 82 on the second area Q22 and the movable body 32 is shorter than the maximum displacement Δh of a tip E of the second mass part 322 toward the Z-axis direction. In other words, D0<Δh is true. Thus, it is possible to arrange the first, second detection electrodes 81, 82 shifted toward the movable body 32 as a whole. Therefore, it is possible to decrease the average separation distances between the movable body 32 and the first, second detection electrodes 81, 82 to increase the capacitances Ca, Cb.

Figure 9:
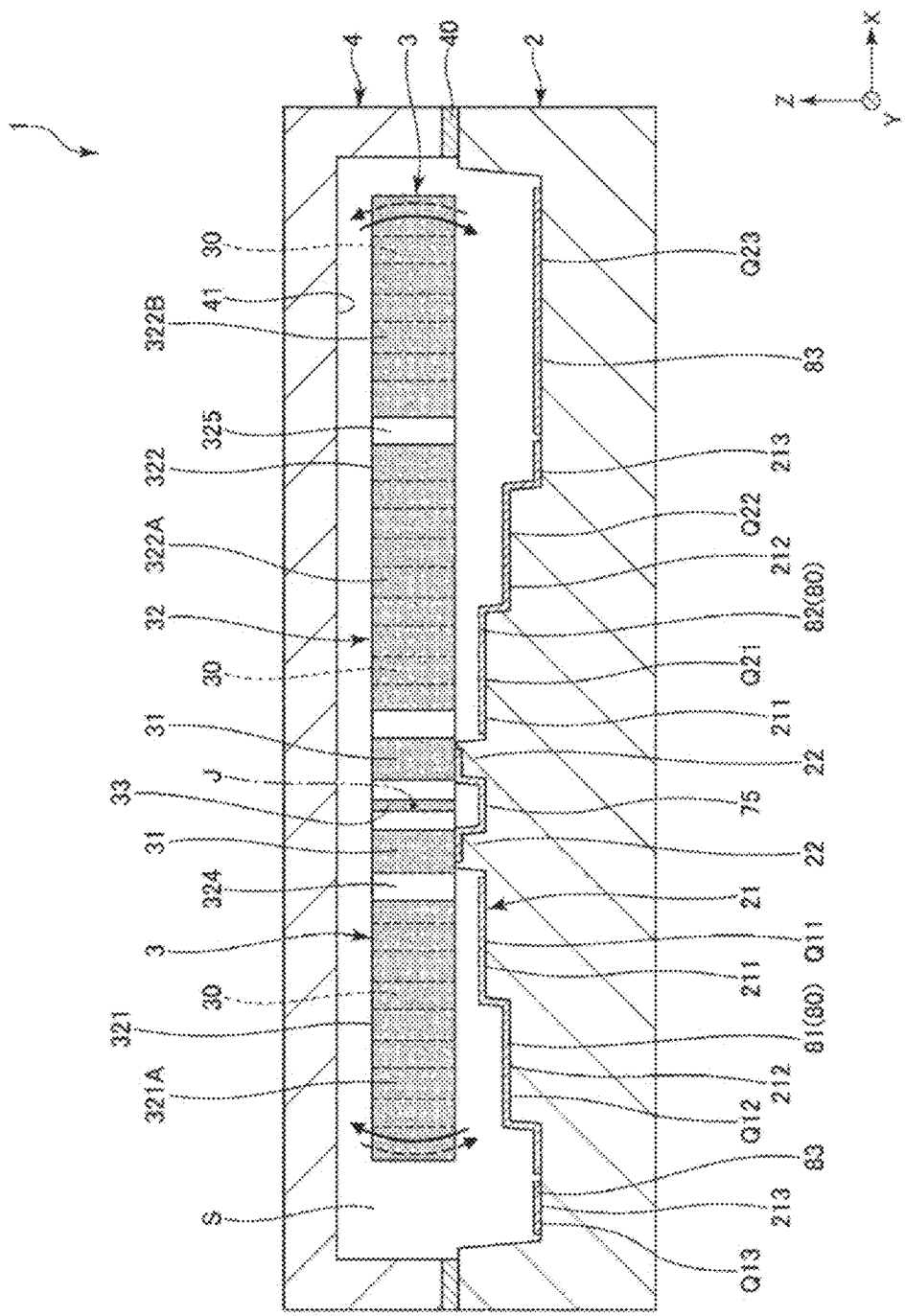
FIG. 9 is a cross-sectional view showing a modified example of the physical quantity sensor shown in FIG. 1.

Further, for example, it is also possible to adopt a configuration in which the recessed part 21 is constituted by the first recessed part 211, the second recessed part 212, and the third recessed part 213, the first detection electrode 81 is disposed so as to straddle the first area Q11, the second area Q12, and the third area Q13, and the second detection electrode 82 is disposed so as to straddle the first area Q21, the second area Q22, and the third area Q23 as shown in FIG. 9. It should be noted that in this configuration, the third areas Q13, Q23 each correspond to the m-th area, and also correspond to the n-th area.

Figure 10:
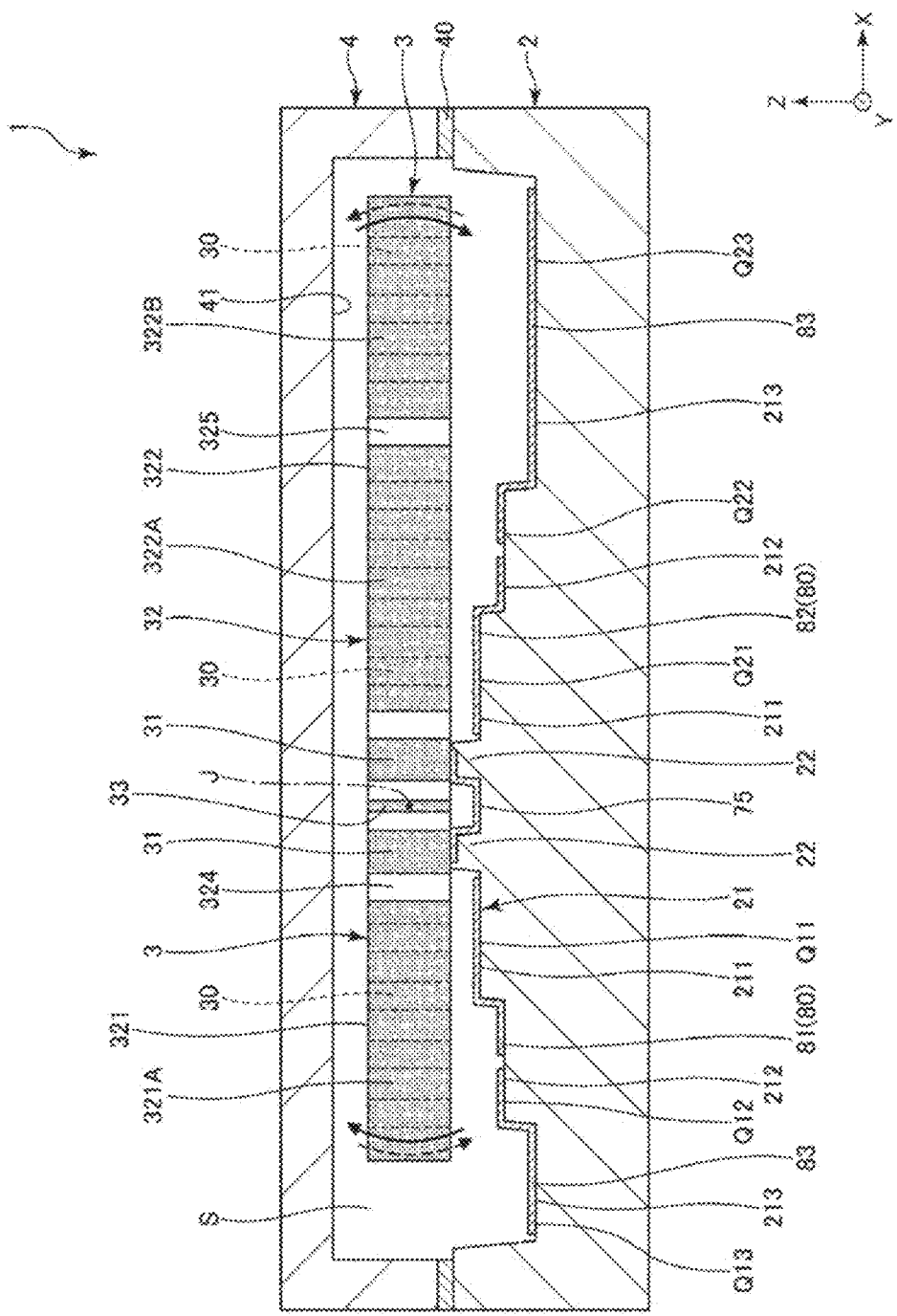
FIG. 10 is a cross-sectional view showing a modified example of the physical quantity sensor shown in FIG. 1.
Figure 11:
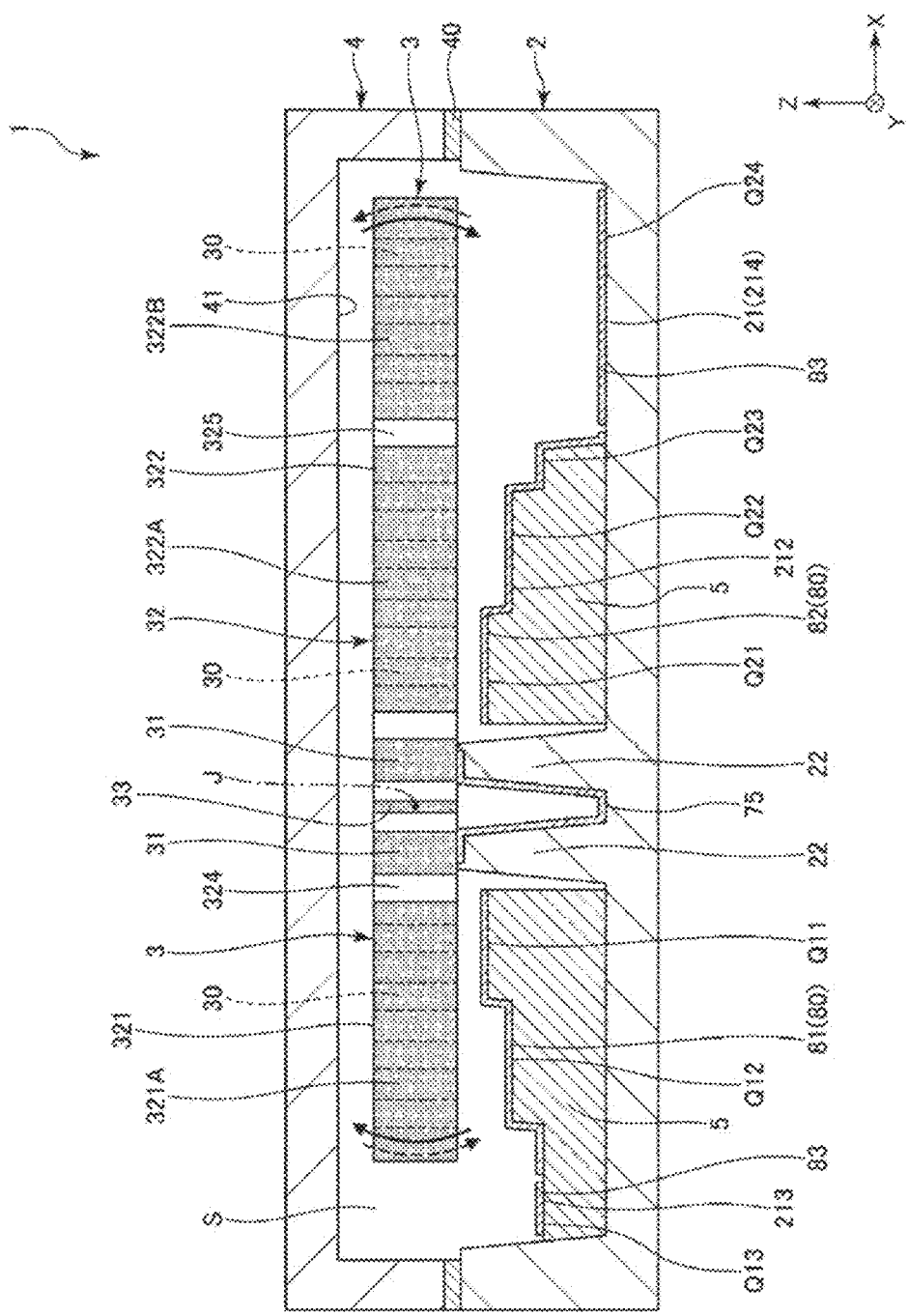
FIG. 11 is a cross-sectional view showing a modified example of the physical quantity sensor shown in FIG. 1.

Further, for example, it is also possible to adopt a configuration in which the recessed part 21 is constituted by the first recessed part 211, the second recessed part 212, and the third recessed part 213, the first detection electrode 81 is disposed so as to straddle the first area Q11 and the second area Q12, and the second detection electrode 82 is disposed so as to straddle the first area Q21 and the second area Q22 as shown in FIG. 10. It should be noted that in this configuration, the third areas Q13, Q23 each correspond to the m-th area, and the second areas Q12, Q22 each correspond to the n-th area.

Figure 12:
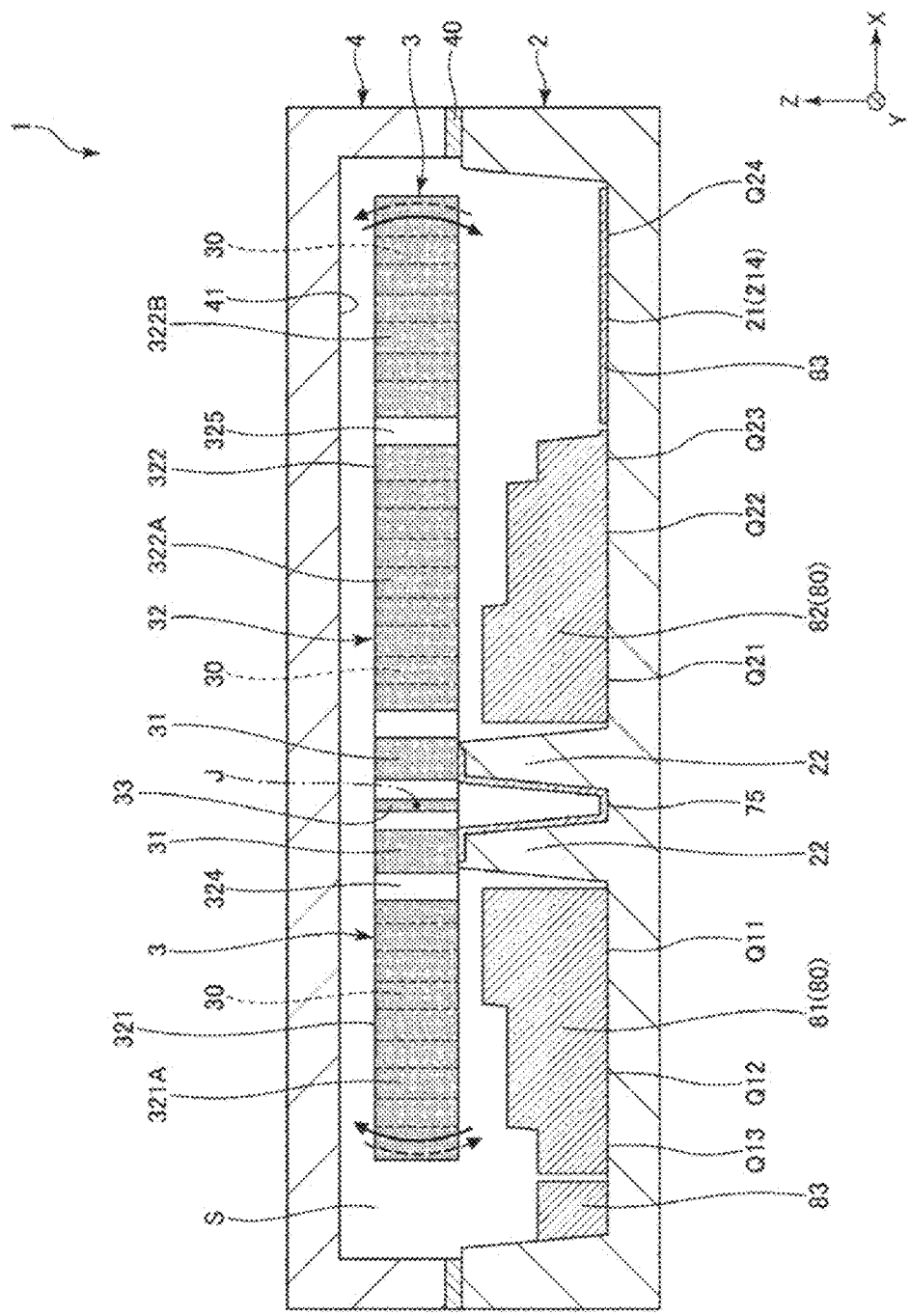
FIG. 12 is a cross-sectional view showing a modified example of the physical quantity sensor shown in FIG. 1.

Further, for example, it is possible to constitute the recessed part 21 by the fourth recessed part 214, dispose a pedestal 5 having a multistep shape formed of a separate member form the substrate 2 on the bottom surface of the recessed part 21, and dispose the first detection electrode 81 and the second detection electrode 82 on the pedestal 5. The constituent material of the pedestal 5 is not particularly limited, and a variety of types of insulating material such as a glass material or a resin material can be used. Further, providing an insulating state between the first detection electrode 81 and the second detection electrode 82 can be ensured, it is also possible to use a variety of metal materials. In the present embodiment, the pedestal 5 is formed of a stacked body of insulating layers 51. Further, it is possible to form the pedestal 5 integrally with the first, second detection electrodes 81, 82. In other words, it is possible to form the recessed part 21 by the fourth recessed part 214, and provide each of the first detection electrode 81 and the second detection electrode 82 with the stepped shape as shown in FIG. 12.

Second Embodiment

Figure 13:
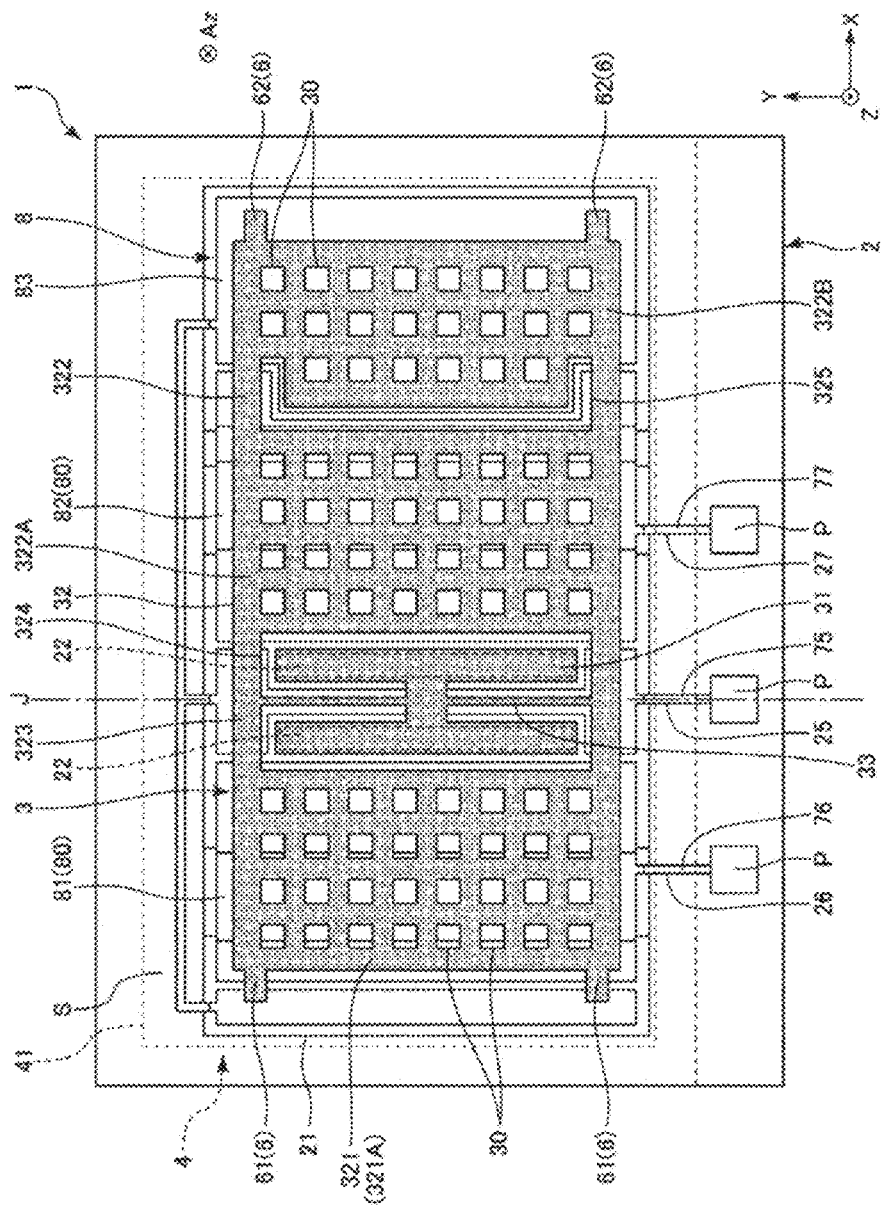
FIG. 13 is a plan view showing a physical quantity sensor according to a second embodiment of the present disclosure.

FIG. 13 is a plan view showing a physical quantity sensor according to a second embodiment of the present disclosure.

The physical quantity sensor 1 according to the present embodiment is substantially the same as the physical quantity sensor 1 according to the first embodiment described above except mainly the point that the configuration of the protrusions 6 is different. It should be noted that in the following description, the physical quantity sensor 1 according to the second embodiment will be described with a focus on the difference from the first embodiment described above, and the description of substantially the same issues will be omitted. Further, in FIG. 13, the constituents substantially the same as in the embodiment described above are denoted by the same reference symbols.

As shown in FIG. 13, in the physical quantity sensor 1 according to the present embodiment, the pair of protrusions 61 each protrude from a tip of the first mass part 321 toward the negative side in the X-axis direction. In contrast, the pair of protrusions 62 each protrude from a tip of the second mass part 322 toward the positive side in the X-axis direction. In such a configuration, by the protrusions 61 making contact with the dummy electrode 83 on the third recessed part 213, the further oscillation of the movable body 32 toward the first detection electrode 81 is restricted, and there is achieved the state in which the movable body 32 makes the maximum displacement. Further, by the protrusions 62 making contact with the dummy electrode 83 on the fourth recessed part 214, the further oscillation of the movable body 32 toward the second detection electrode 82 is restricted, and there is achieved the state in which the movable body 32 makes the maximum displacement.

As described above, in the physical quantity sensor 1 according to the present embodiment, there are included the protrusions 6 each protrude from the movable body 32 to make contact with the substrate 2 to thereby limit the oscillation of the movable body 32 around the oscillation axis J. Thus, it is possible to restrict the excessive oscillation of the movable body 32. Further, sticking of the movable body 32 can effectively be prevented. In particular, it becomes unnecessary to provide the cutouts 811, 821 to the first, second detection electrodes 81, 82 as in the first embodiment described above, and accordingly, it is possible to increase the area of each of the first, second detection electrodes 81, 82. Further, as described above, the "state in which the movable body 32 makes the maximum displacement" described above corresponds to the state in which the substrate 2 has contact with the protrusions 6. Thus, sticking of the movable body 32 can effectively be prevented.

According also to such a second embodiment, there can be exerted substantially the same advantages as in the first embodiment described above.

Third Embodiment

Figure 14:
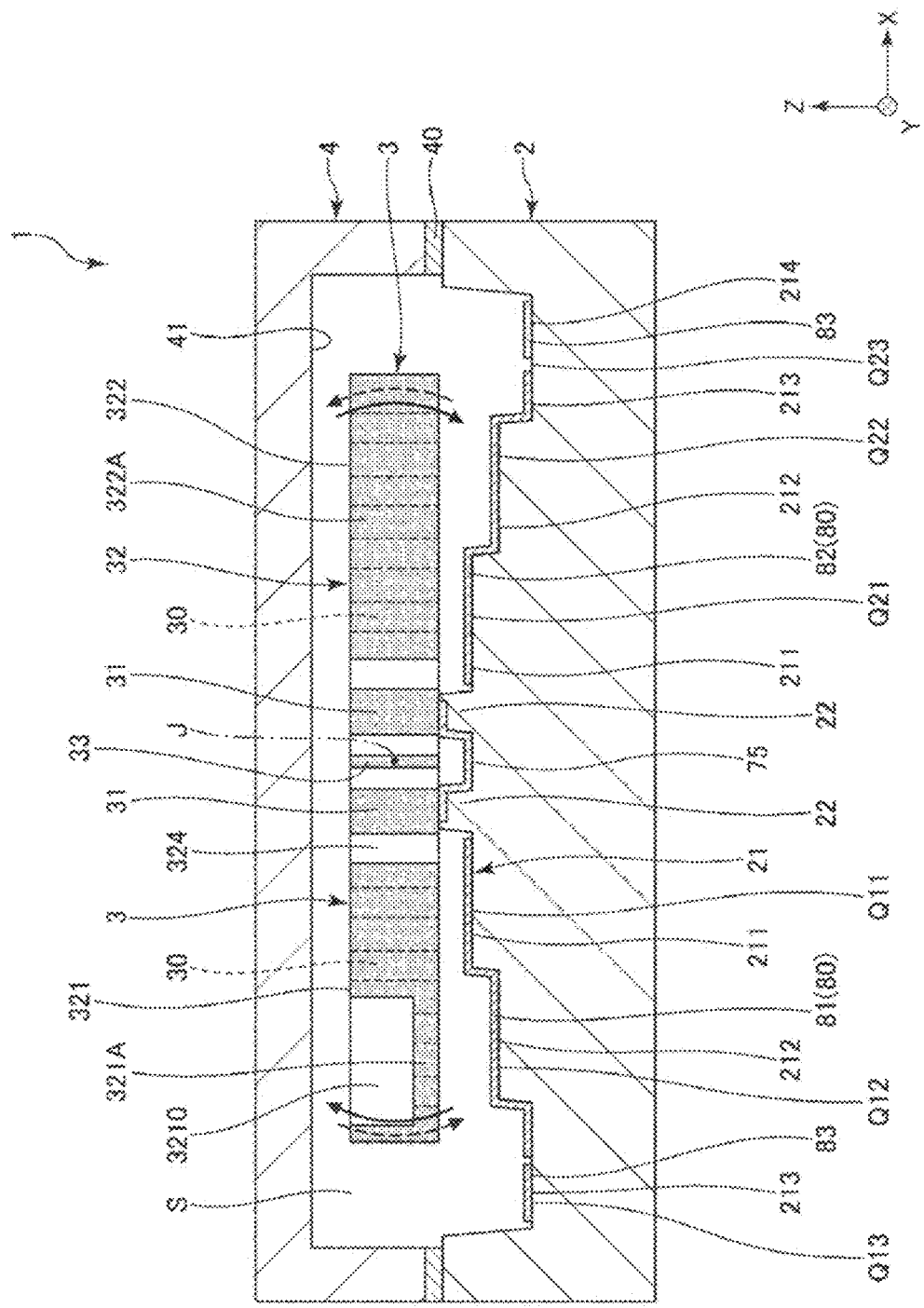
FIG. 14 is a cross-sectional view showing a physical quantity sensor according to a third embodiment of the present disclosure.
Figure 15:
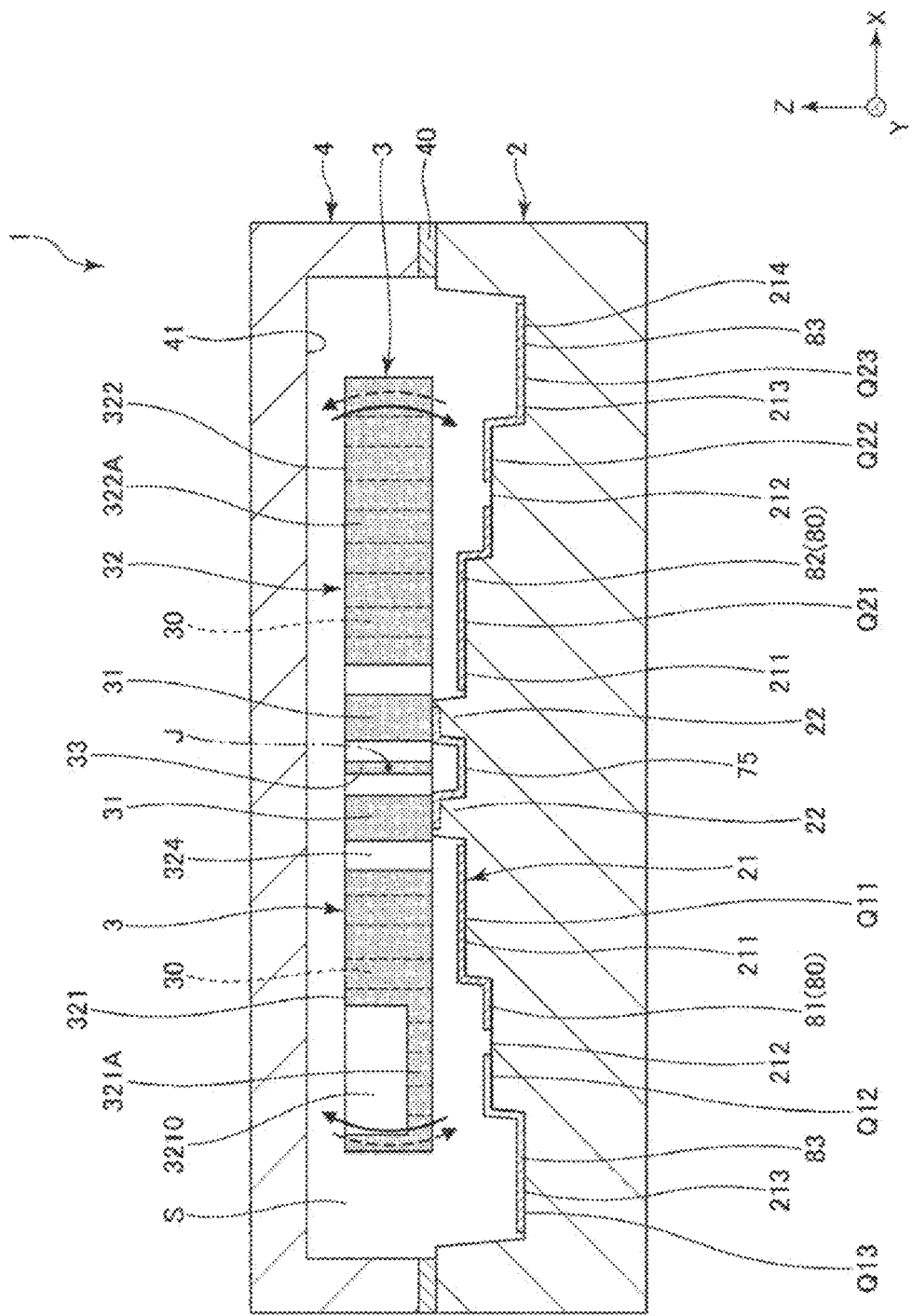
FIG. 15 is a cross-sectional view showing a modified example of the physical quantity sensor shown in FIG. 14.
Figure 16:
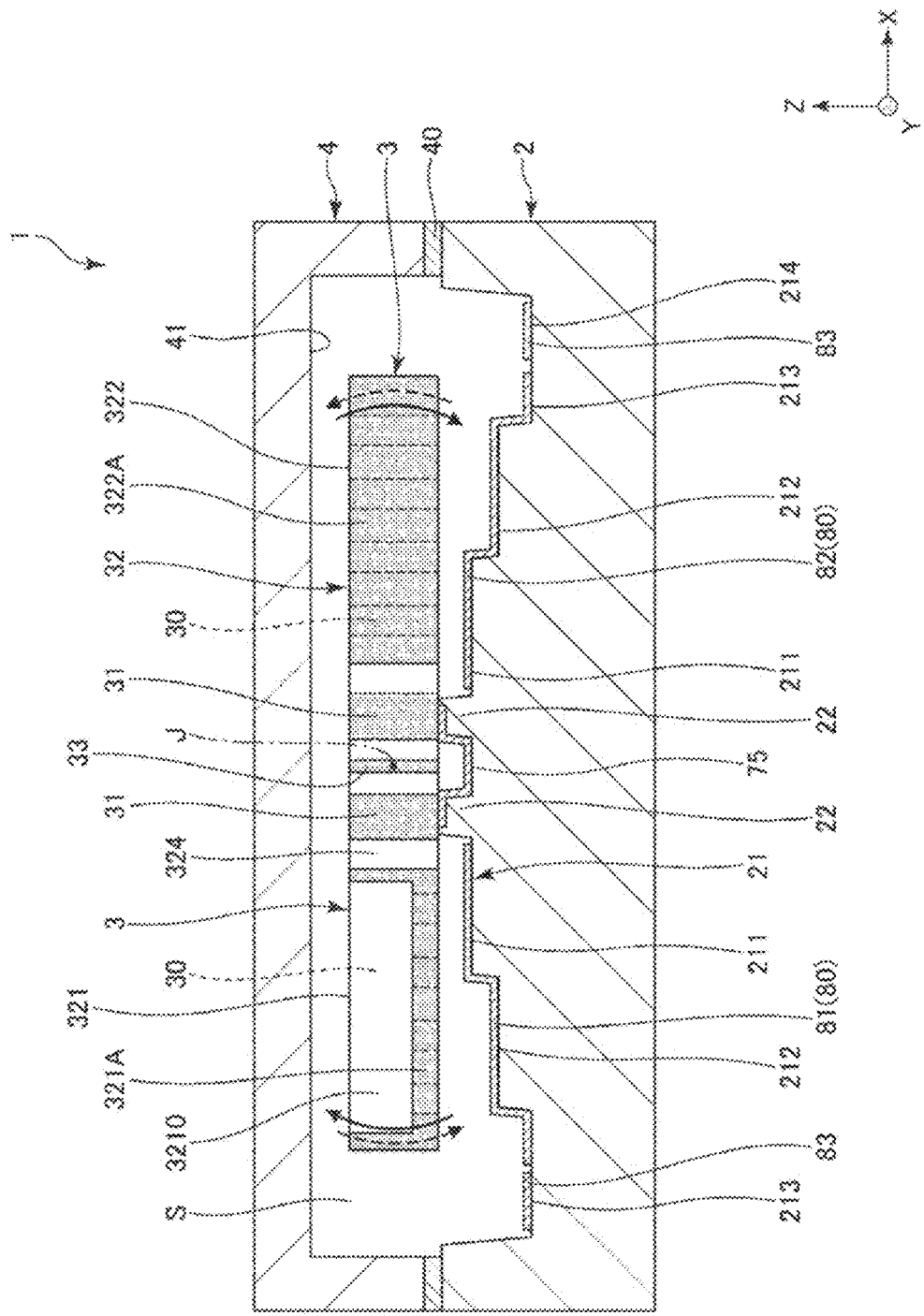
FIG. 16 is a cross-sectional view showing a modified example of the physical quantity sensor shown in FIG. 14.
Figure 17:
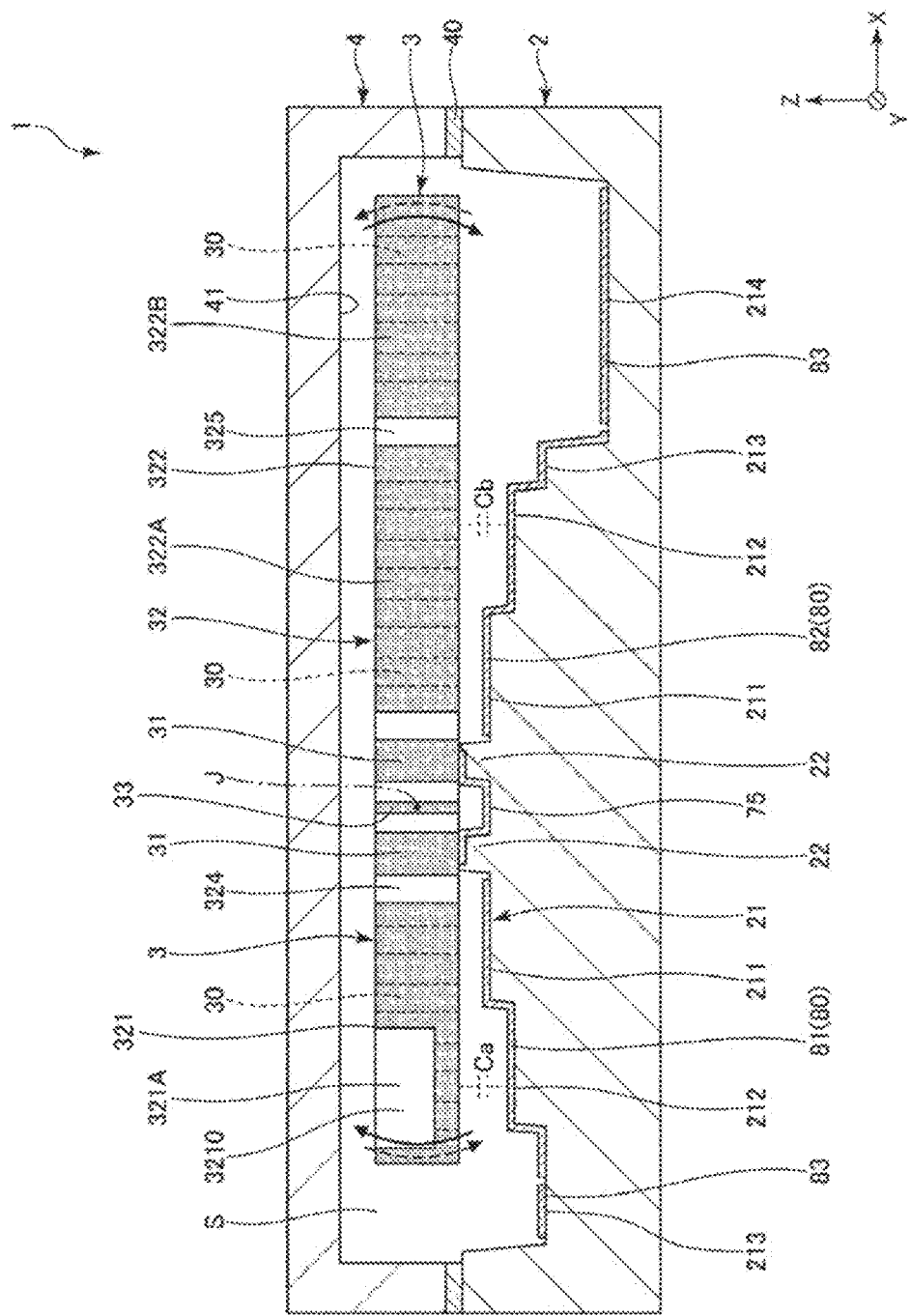
FIG. 17 is a cross-sectional view showing a modified example of the physical quantity sensor shown in FIG. 14.

FIG. 14 is a cross-sectional view showing a physical quantity sensor according to a third embodiment of the present disclosure. FIGS. 15 through 17 are each a cross-sectional view showing a modified example of the physical quantity sensor shown in FIG. 14.

The physical quantity sensor 1 according to the present embodiment is substantially the same as the physical quantity sensor 1 according to the first embodiment described above except mainly the point that the configuration of the protrusions 6 is different. It should be noted that in the following description, the physical quantity sensor 1 according to the third embodiment will be described with a focus on the difference from the first embodiment described above, and the description of substantially the same issues will be omitted. Further, in FIG. 14 through FIG. 17, the constituents substantially the same as those of the embodiments described above are denoted by the same reference symbols.

As shown in FIG. 14, in the physical quantity sensor 1 according to the present embodiment, the torque generation section 322B is omitted from the second mass part 322. In other words, the movable body 32 has the first detection part 321A located at the negative side in the X-axis direction with respect to the oscillation axis J, and the second detection part 322A located at the positive side in the X-axis direction. Further, the first detection part 321A and the second detection part 322A are disposed symmetrically about the oscillation axis J in the plan view.

Further, the first detection part 321A is provided with a recessed part 3210 which opens on an upper surface and has a bottom. Due to the recessed part 3210, the mass of the first detection part 321A decreases, and the first detection part 321A becomes lighter than the second detection part 322A. Thus, a difference in rotational moment occurs between the first detection part 321A and the second detection part 322A, and the seesaw oscillation of the movable body 32 becomes possible. In particular, in the present embodiment, the recessed part 3210 is disposed so as to deviate toward the tip side of the first detection part 321A, and spreads in substantially a tip side half of the first detection part 321A. Thus, it is possible to effectively reduce the rotational moment of the first detection part 321A while keeping the mechanical strength of the first detection part 321A.

Further, as shown in FIG. 14, the recessed part 21 is constituted by the first recessed part 211, the second recessed part 212, and the third recessed part 213, and is disposed symmetrically about the oscillation axis J. Further, at the negative side in the X-axis direction with respect to the oscillation axis J, the first detection electrode 81 is disposed so as to straddle the first area Q11, the second area Q12, and the third area Q13, and at the positive side in the X-axis direction with respect to the oscillation axis J, the second detection electrode 82 is disposed so as to straddle the first area Q21, the second area Q22, and the third area Q23. It should be noted that in this configuration, the third areas Q13, Q23 each correspond to the m-th area, and also correspond to the n-th area.

According also to such a third embodiment, substantially the same advantages as in the first embodiment described above can be exerted.

It should be noted that the physical quantity sensor 1 is not particularly limited. For example, it is also possible to adopt a configuration in which the first detection electrode 81 is disposed so as to straddle the first area Q11 and the second area Q12, and the second detection electrode 82 is disposed so as to straddle the first area Q21 and the second area Q22 as shown in FIG. 15. In this configuration, the third areas Q13, Q23 each correspond to the m-th area, and the second areas Q12, Q22 each correspond to the n-th area. Further, for example, it is possible for the recessed part 3210 to be formed so as to spread in the entire area of the first detection part 321A as shown in FIG. 16. Thus, it is possible to further reduce the rotational moment of the first detection part 321A. Further, it is possible to add the recessed part 3210 to the physical quantity sensor 1 according to the first embodiment described above as shown in FIG. 17. Thus, it is possible to further reduce the rotational moment of the first detection part 321A.

Fourth Embodiment

Figure 18:
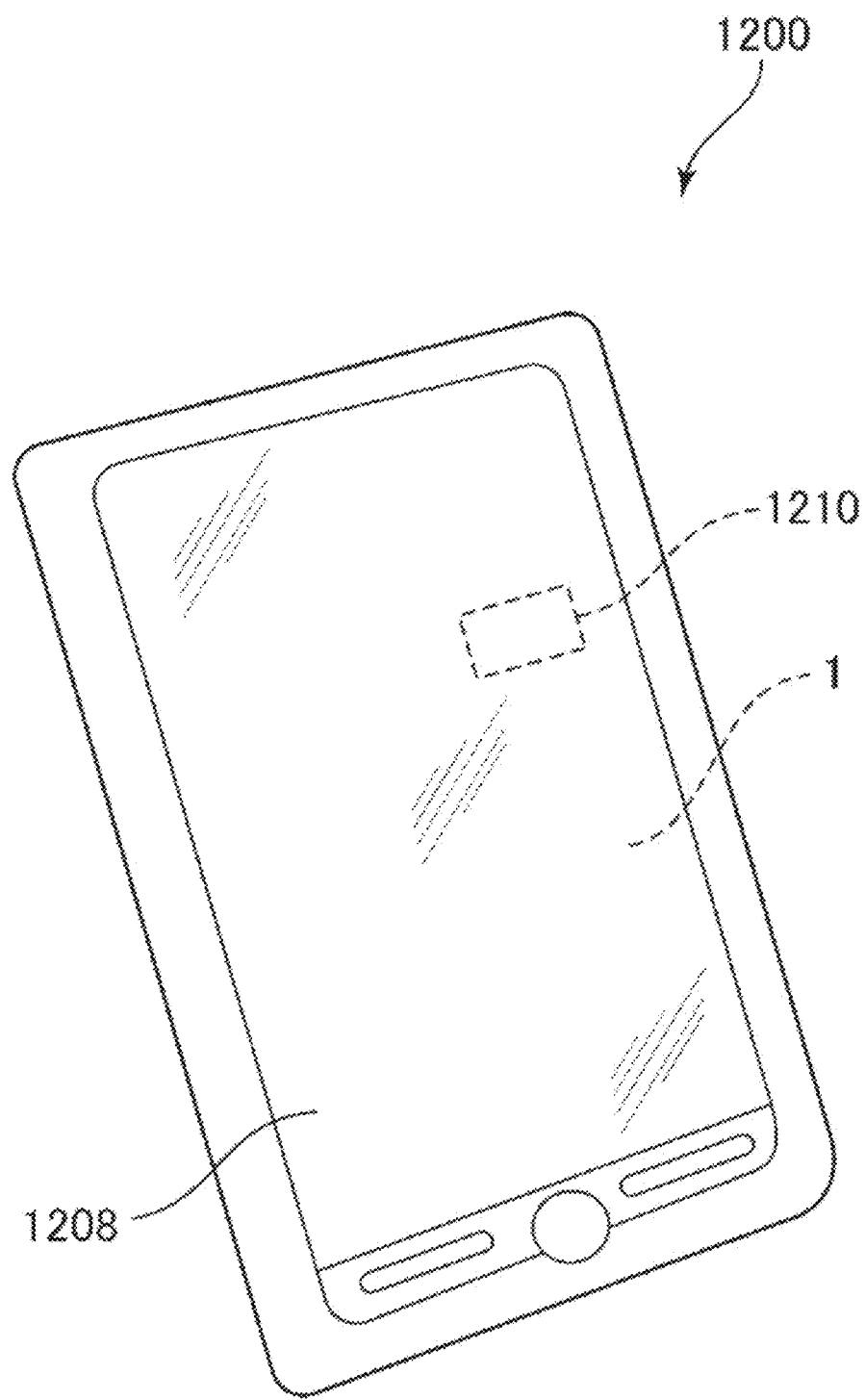
FIG. 18 is a plan view showing a smartphone as an electronic apparatus according to a fourth embodiment.

FIG. 18 is a plan view showing a smartphone as an electronic apparatus according to a fourth embodiment.

The electronic apparatus according to the present disclosure is implemented in the smartphone 1200 shown in FIG. 18. The smartphone 1200 incorporates the physical quantity sensor 1, and a control circuit 1210 for performing control based on a detection signal output from the physical quantity sensor 1. Detection data detected by the physical quantity sensor 1 is transmitted to the control circuit 1210, and the control circuit 1210 is capable of recognizing the attitude and the behavior of the smartphone 1200 from the detection data thus received, and then changing the display image currently displayed on a display section 1208, outputting an alarm or sound effects, or driving a vibration motor to vibrate the main body.

Such a smartphone 1200 as the electronic apparatus has the physical quantity sensor 1, and the control circuit 1210 for performing the control based on the detection signal output from the physical quantity sensor 1. Therefore, it is possible to appreciate the advantages of the physical quantity sensor 1 described above, and the high reliability can be exerted.

It should be noted that besides the smartphone 1200 described above, the electronic apparatus according to the present disclosure can be applied to, for example, a personal computer, a digital still camera, a tablet terminal, a timepiece, a smart watch, an inkjet printer, a television set, a wearable terminal such as a pair of smart glasses or an HMD (head-mounted display), a video camera, a video cassette recorder, a car navigation system, a drive recorder, a pager, a personal digital assistance, an electronic dictionary, an electronic translator, an electronic calculator, a computerized game machine, a toy, a word processor, a workstation, a video phone, a security video monitor, electronic binoculars, a POS terminal, medical equipment, a fish finder, a variety of measurement instruments, equipment for a mobile terminal base station, a variety of gauges for a vehicle, a railroad wheel, an airplane, a helicopter, a ship, or a boat, a flight simulator, and a network server.

Fifth Embodiment

Figure 19:
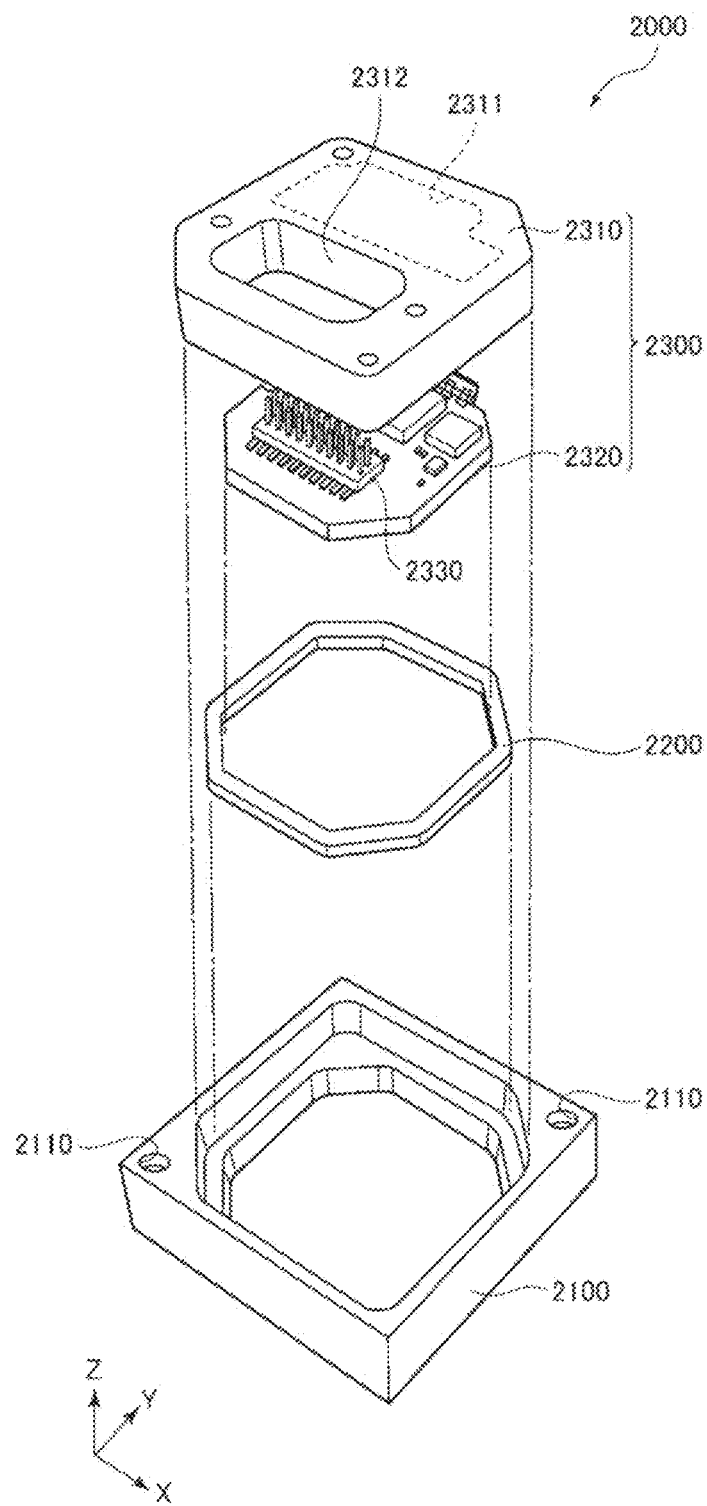
FIG. 19 is an exploded perspective view showing an inertial measurement device as an electronic apparatus according to a fifth embodiment.
Figure 20:
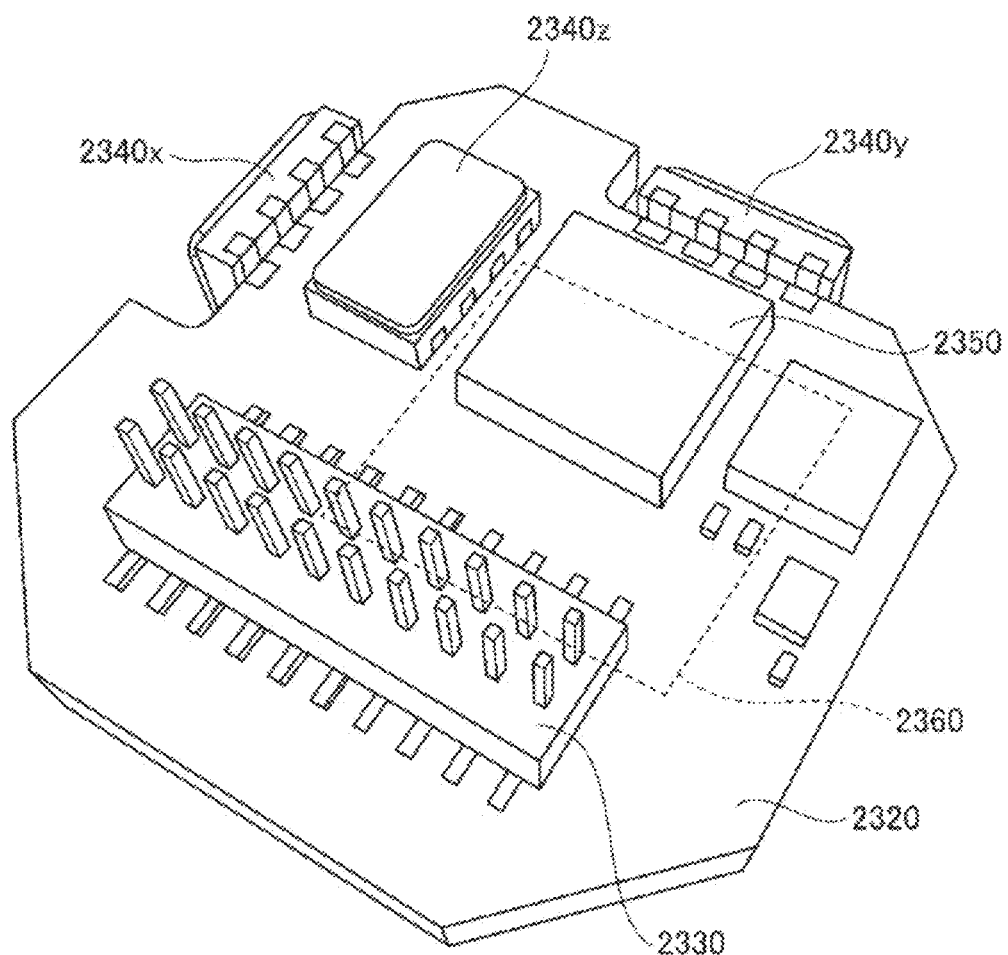
FIG. 20 is a perspective view of a board provided to the inertial measurement device shown in FIG. 19.

FIG. 19 is an exploded perspective view showing an inertial measurement device as an electronic apparatus according to a fifth embodiment. FIG. 20 is a perspective view of a board provided to the inertial measurement device shown in FIG. 19.

An inertial measurement device 2000 (IMU: Inertial Measurement Unit) as the electronic apparatus shown in FIG. 19 is an inertial measurement device for detecting the attitude and the behavior of an installation target device such as a car or a robot. The inertial measurement device 2000 functions as a six-axis motion sensor provided with a three-axis acceleration sensor and a three-axis angular velocity sensor.

The inertial measurement device 2000 is a rectangular solid having a substantially square planer shape. Further, screw holes 2110 as fixation sections are formed in the vicinity of the two vertexes located in a diagonal direction of the square. It is possible to fix the inertial measurement device 2000 to an installation target surface of an installation target body such as a car by screwing two screws into the two screw holes 2110. It should be noted that it is also possible to reduce the inertial measurement device 2000 in size so as to be installed in, for example, a smartphone or a digital camera due to selection of the components or design changes.

The inertial measurement device 2000 has an outer case 2100, a bonding member 2200, and a sensor module 2300, and has a configuration of inserting the sensor module 2300 inside the outer case 2100 with the intervention of the bonding member 2200. The outer shape of the outer case 2100 is a rectangular solid having a substantially square planar shape similarly to the overall shape of the inertial measurement device 2000 described above, and the screw holes 2110 are respectively formed in the vicinity of the two vertexes located in the diagonal direction of the square. Further, the outer case 2100 is shaped like a box, and the sensor module 2300 is housed therein.

The sensor module 2300 has an inner case 2310 and a board 2320. The inner case 2310 is a member for supporting the board 2320, and has a shape fitting into the inside of the outer case 2100. Further, the inner case 2310 is provided with a recessed part 2311 for preventing the contact with the board 2320, and an opening 2312 for exposing a connector 2330 described later. Such an inner case 2310 is bonded to the outer case 2100 via the bonding member 2200. Further, to a lower surface of the inner case 2310, there is bonded the board 2320 with an adhesive.

As shown in FIG. 20, on an upper surface of the board 2320, there are mounted a connector 2330, an angular velocity sensor 2340z for detecting the angular velocity around the Z axis, an acceleration sensor 2350 for detecting the acceleration in each of the axial directions of the X axis, the Y axis, and the Z axis, and so on. Further, on side surfaces of the board 2320, there are mounted an angular velocity sensor 2340x for detecting the angular velocity around the X axis, and an angular velocity sensor 2340y for detecting the angular velocity around the Y axis. Further, it is possible to use the physical quantity sensor according to the present disclosure as, for example, the acceleration sensor 2350.

Further, on a lower surface of the board 2320, there is mounted a control IC 2360. The control IC 2360 is an MCU (Micro Controller Unit), and controls each section of the inertial measurement device 2000. A storage section stores a program defining the sequence and the contents for detecting the acceleration and the angular velocity, a program for digitalizing the detection data to be incorporated in the packet data, the associated data, and so on. It should be noted that on the board 2320, a plurality of electronic components is additionally mounted.

Sixth Embodiment

Figure 21:
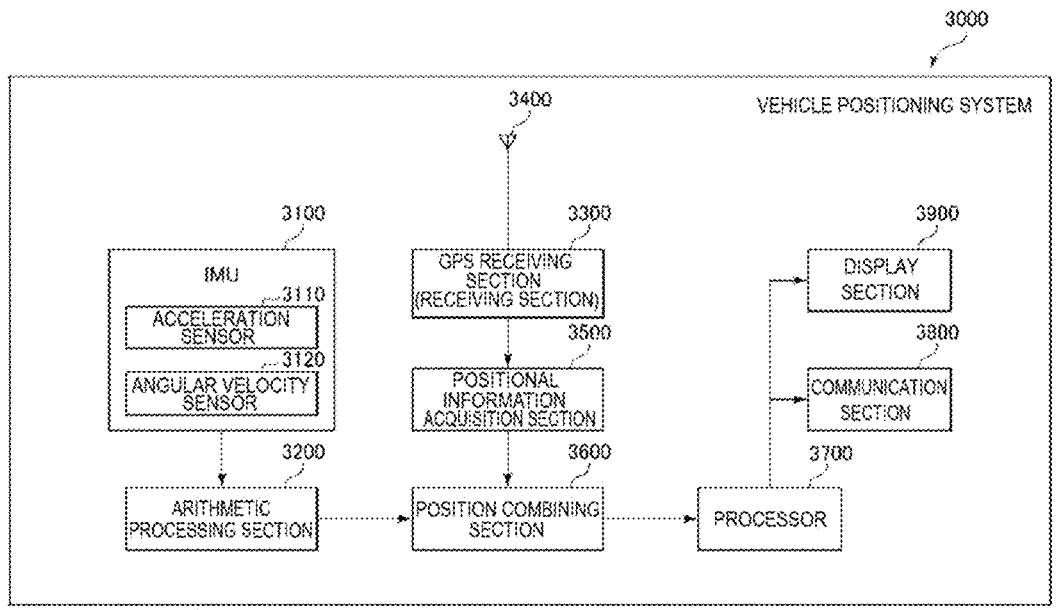
FIG. 21 is a block diagram showing an overall system of a vehicle positioning system as an electronic apparatus according to a sixth embodiment.
Figure 22:
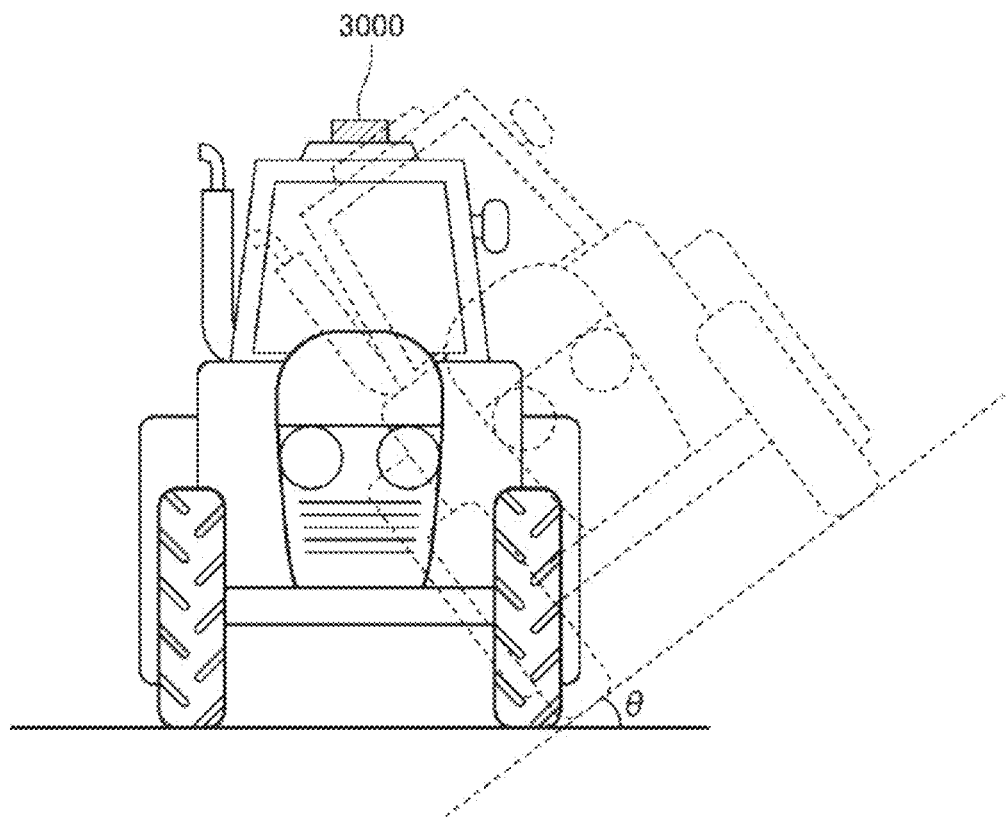
FIG. 22 is a diagram showing an operation of the vehicle positioning system shown in FIG. 21.

FIG. 21 is a block diagram showing an overall system of a vehicle positioning system as an electronic apparatus according to a sixth embodiment. FIG. 22 is a diagram showing an operation of the vehicle positioning system shown in FIG. 21.

A vehicle positioning system 3000 shown in FIG. 21 is a device used while being installed in a vehicle for performing the positioning of the vehicle. It should be noted that the vehicle is not particularly limited and can be any one of a bicycle, a car, a motorbike, an electrical train, an airplane, and a ship or a boat, but in the present embodiment, there is described when a four-wheeled car, in particular a farm tractor, is used as the vehicle.

The vehicle positioning system 3000 has an inertial measurement device 3100 (IMU), an arithmetic processing section 3200, a GPS receiving section 3300, a receiving antenna 3400, a positional information acquisition section 3500, a position combining section 3600, a processor 3700, a communication section 3800, and a display section 3900. It should be noted that as the inertial measurement device 3100, it is possible to use, for example, the inertial measurement device 2000 described above.

The inertial measurement device 3100 has a three-axis acceleration sensor 3110 and a three-axis angular velocity sensor 3120. The arithmetic processing section 3200 receives acceleration data from the acceleration sensor 3110 and angular velocity data from the angular velocity sensor 3120, performs the inertial navigation arithmetic process on these data, and then outputs inertial navigation positioning data including the acceleration and the attitude of the vehicle.

Further, the GPS receiving section 3300 receives signals from GPS satellites with the receiving antenna 3400. Further, the positional information acquisition section 3500 outputs the GPS positioning data representing the position (the latitude, the longitude, and the altitude), the velocity, and the orientation of the vehicle positioning system 3000 based on the signals received by the GPS receiving section 3300. The GPS positioning data also includes status data representing the reception condition, the reception time, and so on.

The position combining section 3600 calculates the position of the vehicle, specifically what position on the land the vehicle is running, based on the inertial navigation positioning data output from the arithmetic processing section 3200 and the GPS positioning data output from the positional information acquisition section 3500. For example, even when the position of the vehicle included in the GPS positioning data is the same, when the attitude of the vehicle is different due to the influence of a tilt θ of the land and so on as shown in FIG. 22, it results in that the vehicle is running at the different position on the land. Therefore, it is unachievable to calculate the accurate position of the vehicle with the GPS positioning data alone. Therefore, the position combining section 3600 calculates what position on the land the vehicle is running using the inertial navigation positioning data.

Predetermined processing is performed by the processor 3700 on the positional data output from the position combining section 3600, and then the result is displayed on the display section 3900 as the positioning result. Further, it is also possible to arrange that the positional data is transmitted to an external device by the communication section 3800.

Seventh Embodiment

Figure 23:
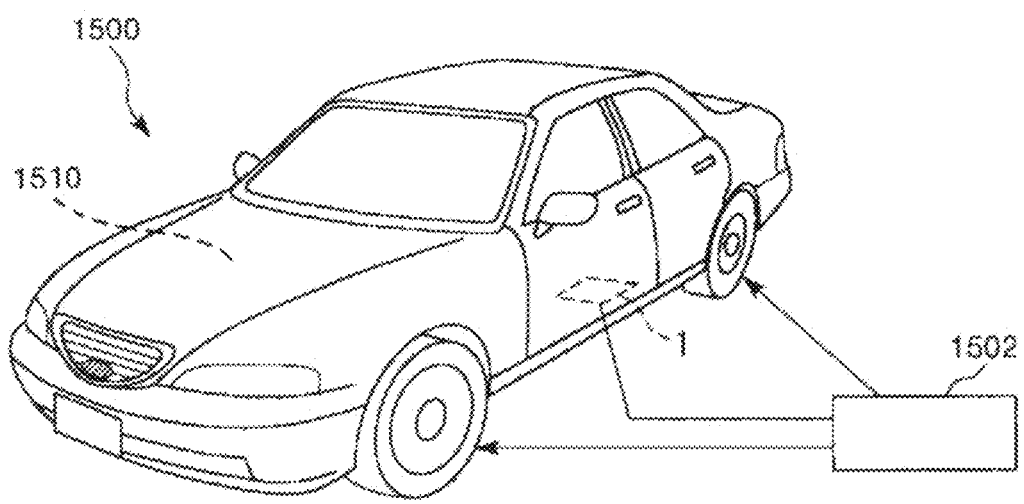
FIG. 23 is a perspective view showing a vehicle according to a seventh embodiment.

FIG. 23 is a perspective view showing a vehicle according to a seventh embodiment.

A car 1500 shown in FIG. 23 is an application of the vehicle according to the present disclosure. In this drawing, the car 1500 includes a system 1510 corresponding to at least any of an engine system, a brake system, and a keyless entry system. Further, the car 1500 incorporates the physical quantity sensor 1, and is capable of detecting the attitude of the car body using the physical quantity sensor 1. The detection signal of the physical quantity sensor 1 is supplied to a control circuit 1502, and the control circuit 1502 is capable of controlling the system 1510 based on the detection signal.

As described above, the car 1500 as the vehicle has the physical quantity sensor 1, and the control circuit 1502 for performing the control based on the detection signal output from the physical quantity sensor 1. Therefore, it is possible to appreciate the advantages of the physical quantity sensor 1 described above, and the high reliability can be exerted.

It should be noted that besides the above, the physical quantity sensor 1 can widely be applied to an electronic control unit (ECU) such as a car navigation system, a car air-conditioner, an anti-lock braking system (ABS), an airbag system, a tire pressure monitoring system (TPMS), an engine controller, or a battery monitor for a hybrid car or an electric car. Further, the vehicle is not limited to the car 1500, but can also be applied to, for example, a railroad wheel, an airplane, a helicopter, a rocket, an artificial satellite, a ship and a boat, an AGV (automated guided vehicle), an elevator, an escalator, a two-legged robot, an unmanned drone such as a drone, and a toy such as a radio control model or a model train.

Although the physical quantity sensor, the electronic apparatus, and the vehicle according to the present disclosure are hereinabove described based on the illustrated embodiments, the present disclosure is not limited to these embodiments, but the constituents of each section can be replaced with those having substantially the same functions and arbitrary configurations. Further, the present disclosure can also be added with any other constituents. Further, it is possible to arbitrarily combine the embodiments described above such as the combination of the first embodiment and the third embodiment shown in FIG. 17. Further, it is possible to omit the protrusions 6 from all of the embodiments described above.

Further, although in the embodiments described above, there is described the configuration in which the physical quantity sensor detects the acceleration, the physical quantity to be detected by the physical quantity sensor is not particularly limited, and can be, for example, an angular velocity or pressure.

What is claimed is:

1. A physical quantity sensor comprising:
a substrate having a mount part, the substrate having first through m-th recesses continuously disposed therein from the mount part so as to have a first corner through an (m−1)-th corner between two adjacent recesses, each of the recesses being progressively deeper from the first recess to the m-th recess, wherein the m is an integer no smaller than 3;
a movable body configured by a fixation part and a movable part, the movable body being connected to the mount part of the substrate only via the fixation part, the movable part of the movable body being spaced apart from the substrate via a gap along a first direction, the movable part oscillating around an oscillation axis along a second direction perpendicular to the first direction with respect to the substrate;
a detection electrode continuously disposed on bottoms and side walls of the first recess through the m-th recess along a third direction so as to be opposed to the movable part of the movable body, the third direction being perpendicular to the first and second directions; and
a protrusion configured to limit the oscillation of the movable part of the movable body around the oscillation axis, the protrusion protruding from the substrate to make contact with the movable body or protruding from the movable body to make contact with the substrate,
wherein, in a cross-sectional view from the second direction,
a first imaginary straight line is defined as a line having a smallest angle formed with the angle formed with the third direction out of imaginary straight lines connecting two directly adjacent corners of the first corner through the (m−1)-th corner, and
a second imaginary straight line is defined as a line extending along a principal surface facing the substrate of the movable body in a state in which the movable body makes a maximum displacement around the oscillation axis,
the first imaginary straight line and the second imaginary straight line fail to cross each other in an area between a first normal line and a second normal line,
the first normal line passes through one corner of the first corner through the (m−1)-th corner and extends in the first direction, and
the second normal line passes through another corner of the first corner through the (m−1)-th corner and extends in the first direction.

2. The physical quantity sensor according to claim 1, wherein
in the cross-sectional view from the second direction,
the first imaginary straight line and the second imaginary straight line fail to cross each other in an area between a third normal line which crosses the oscillation axis, and which extends in the first direction, and a fourth normal line which passes an end part of the movable body, and which extends in the first direction.

3. The physical quantity sensor according to claim 1, wherein
the movable body has a first detection part and a second detection part disposed symmetrically about the oscillation axis,
the detection electrode include a first detection electrode overlapping the first detection part, and a second detection electrode overlapping the second detection part, and
the first detection electrode and the second detection electrode are disposed symmetrically about the oscillation axis.

4. The physical quantity sensor according to claim 1, wherein
the maximum displacement corresponds to one of a state in which the movable body is in contact with the protrusion or a state in which the substrate is in contact with the protrusion.

5. The physical quantity sensor according to claim 1, wherein
the protrusion has the same electrical potential as the movable body.

6. The physical quantity sensor according to claim 1, further comprising:
a dummy electrode which is disposed in a portion as an area of the substrate where the detection electrode is not disposed and opposed to the movable body, and which has the same electrical potential as the movable body.

7. The physical quantity sensor according to claim 1, wherein
a separation distance from the movable body increases in an order of the first recess toward the m-th recess.

8. The physical quantity sensor according to claim 1, wherein
a separation distance between the detection electrode and the movable body on the m-th recess is smaller than the maximum displacement of an end part of the movable body toward the first direction.

9. The physical quantity sensor according to claim 1, wherein
a separation distance between the detection electrode and the movable body is no larger than 3.5 μm.

10. The physical quantity sensor according to claim 1, wherein
a separation distance between the detection electrode and the movable body is no larger than 2.5 μm.

11. An electronic apparatus comprising:
the physical quantity sensor according to claim 1; and
a control circuit configured to perform control based on a detection signal output from the physical quantity sensor.

12. A vehicle comprising:
the physical quantity sensor according to claim 1; and
a control circuit configured to perform control based on a detection signal output from the physical quantity sensor.

* * * * *